(12) United States Patent
Ogino et al.

(10) Patent No.: US 7,338,195 B2
(45) Date of Patent: Mar. 4, 2008

(54) SURFACE LIGHT SOURCE DEVICE

(75) Inventors: Tatsuya Ogino, Kusatus (JP); Jyunichiro Tsuji, Kusatus (JP)

(73) Assignee: Omron Corporation, Kyoto (JP)

( * ) Notice: Subject to any disclaimer, the term of this patent is extended or adjusted under 35 U.S.C. 154(b) by 73 days.

(21) Appl. No.: 10/565,710

(22) PCT Filed: Jul. 30, 2004

(86) PCT No.: PCT/JP2004/010940

§ 371 (c)(1),
(2), (4) Date: Jan. 25, 2006

(87) PCT Pub. No.: WO2005/012787

PCT Pub. Date: Feb. 10, 2005

(65) Prior Publication Data

US 2006/0245207 A1   Nov. 2, 2006

(30) Foreign Application Priority Data

Jul. 31, 2003   (JP) ............................. 2003-204570

(51) Int. Cl.
*F21V 7/04* (2006.01)
(52) U.S. Cl. ...................... 362/612; 362/600; 362/652; 362/426
(58) Field of Classification Search ................ 362/600, 362/602, 610, 611, 613, 634, 396
See application file for complete search history.

(56) References Cited

U.S. PATENT DOCUMENTS

| | | | | |
|---|---|---|---|---|
| 6,979,113 B2* | 12/2005 | Nakano | ....................... | 362/633 |
| 7,083,317 B2* | 8/2006 | Higashiyama | ............... | 362/612 |
| 7,095,461 B2* | 8/2006 | Kim | ............................ | 349/58 |
| 7,188,990 B2* | 3/2007 | Morito | ........................ | 362/634 |

FOREIGN PATENT DOCUMENTS

| | | |
|---|---|---|
| JP | 3-5152 | 1/1991 |
| JP | H06-22823 | 6/1994 |
| JP | 7-287228 | 10/1995 |
| JP | 10-334718 | 12/1998 |

OTHER PUBLICATIONS

English Translation of Japanese Publication No. H06-22823; (5 pages), Jun. 15, 1994.
esp@cenet Patent Abstract JP10334718 published Dec. 18, 1998 (1 page).
esp@cenet Patent Abstract JP7287228 published Oct. 31, 1995 (1 page).
International Search Report for PCT/JP2004/010940, published Nov. 2, 2004 (2 pages).

* cited by examiner

*Primary Examiner*—Ali Alavi
(74) *Attorney, Agent, or Firm*—Osha Liang LLP

(57) ABSTRACT

A surface light source device has a light-conductor plate that conducts light at an interior and allows same to exit at a light-exit surface to an outside, and a light source arranged oppositely to a light incident surface of the light-conductor plate and small in size as compared to a width of the light-conductor plate. The light source is held by a fixture engaged on the light-conductor plate. The fixture in part is elastically abutted against an opposite surface of the light source to a surface thereof facing to the light incident surface thereby urging the light source on the light incident surface. The fixture and the light-conductor plate are aligned to each other thicknesswise of the light-conductor plate, and the fixture and the light source are aligned to each other thicknesswise of the light-conductor plate.

7 Claims, 29 Drawing Sheets

Deviation in height δ [μm]

SURFACE LIGHT SOURCE DEVICE

TECHNICAL FIELD

The present invention relates to surface light source devices. More particularly, the invention relates to a surface light source device for use as a backlight, a front-light or the like for a liquid-crystal display or other display apparatuses.

BACKGROUND ART

Conventionally, various displays including liquid-crystal displays use surface light source devices as backlights, front-lights and the like. For liquid-crystal displays featured small in thickness and light in weight, there are increasing demands for the displays of personal computers, etc. However, no light emissions occur on the liquid-crystal panel per se, external light or a supplementary light source is required in order to view the content being displayed. Meanwhile, there are recent needs toward thickness reduction and power saving due to greatly increasing demands for liquid-crystal displays on the mobile devices such as cellular phones and PDAs. For this reason, efficient utilization of light is of a problem of importance.

Under the technical background like the above, transition is gradually from those using so-called linear light sources, such as cold cathode tubes to surface light sources using LEDs (light-emitting diodes). There is a desire to construct a surface light source device with using LEDs in the number to a possible small extent.

The surface light source device using so-called a point light source is based on the principle that the light emitted from a point light source is introduced to the interior of a light-conductor plate through its light incident surface, and spread throughout the light-conductor plate while being totally reflected at between the main and back surfaces of the light-conductor plate. By a polarization pattern formed in the backside of the light-conductor plate, the light is caused to exit toward the front so that the light can exit at the surface of the light-conductor plate.

FIG. 1(*a*) is a plan view showing a structure of a conventional surface light source device 1, FIG. 1(*b*) is a cross-sectional view on line X-X in FIG. 1(*a*), and FIG. 1(*c*) is a bottom view of the surface light source device 1. In the surface light source device 1, a point light source 2 resin-encapsulated with an LED chip is mounted on a flexible printed board 4 by use of solder 3. The flexible printed board 4 is opened with a crimp hole 5. The light-conductor plate 6, a transparent resin mold, is formed with a light-emission window 7 in a corner thereof. In the vicinity of the light-emission window 7, a crimp pin 8 projects in an underside of the light-conductor plate 6. The point light source 2 is inserted in the light-emission window 7 of the light-conductor plate 6, and the crimp pin 8 is inserted through the crimp hole 5 of the flexible printed board 4. The crimp pin 8 is heated and crushed thereby effecting thermal crimping and fixing the point light source 2 onto the light-conductor plate 6.

However, in the surface light source device 1 of such a structure, in case the light-emission window 7 of the light-conductor plate 6 and the point light source 2 are the just equal in size, there is a difficulty in automatically inserting the point light source 2 in the light-emission window 7. Thus, a slight clearance is provided to between the point light source 2 and the light-emission window 7. Consequently, in the state the point light source 2 is mounted, a gap occurs between a front surface (light-emission window) of the point light source 2 and a wall surface (light incident surface) of the light-emission window 7. As shown in FIG. 2, light leak readily occurs through the gap toward the main and back surfaces of the light-conductor plate 6, thus making it impossible to efficiently introduce the light emitted from the point light source 2 into the light-conductor plate 6. Thus, there is a problem of lowering in light utilization efficiency. Particularly, on the surface light source device using a point light source 2, such light leak is to cause a great reduction of light utilization efficiency because the emission light amount at light source is lower as compared to the cold cathode tube or the like.

Meanwhile, in such a surface light source device 1, the flexible printed board 4 is thermally crimped by the crimp pin 8, the crimp pin 8 is considerably long in projection length even after thermal crimping if considering a setup strength. Usually, the thickness d in the crimping portion is as great as 0.3 mm. Consequently, the thickness of the surface light source device 1 overall including the crimp pin 8 is significantly great as compared to the thickness of the light-conductor plate 6 itself in the region other than the crimp pin 8, resulting in an increased thickness of the entire surface light source device 1 and hence a difficulty in reducing the thickness thereof.

Furthermore, in such a surface light source device 1, because the point light source 2 in plan is aligned with the light-emission window 7, the positional accuracy in plan thereof is favorable. However, in the direction thicknesswise of the light-conductor plate 6, the point light source 2 is aligned by abutting the flexible printed board 4 against an underside of the light-conductor plate 6. There undergo affections due to the variation, etc. in thickness of a solder 3 and inclination of an LED chip mounted, resulting in deviation in positional accuracy of the point light source 2 in the height direction. In case such variation in the height direction exists where a gap like the above is occurring between the front surface of the point light source 2 and the wall surface of the light-emission window 7 as mentioned above, light leak increases thus resulting in a problem of further lowering in light utilization efficiency.

For this reason, in order to eliminate the gap of between the front surface of the point light source 2 and the wall surface of the light-emission window 7, there is a proposal that a projection 9 protruding from the wall surface of the light-emission window 7 is abutted against a backside of the point light source 2 to thereby urge the front surface of the point light source 2 on the wall surface of the light-emission window 7. This structure can decrease the leak of the light emitted from the point light source 2. However, even this structure still requires a crimp pin 8 thus not solving the problem that the surface light source device 1 is increased in thickness into a difficulty to reduce the thickness.

Meanwhile, there are strong demands for device thickness reduction as seen in portable appliances, which inevitably imposes the need to reduce the thickness of the surface light source devices correspondingly. The conventional surface light source device has the overall thickness of 1.3 mm. Recently, demand is for a surface light source device having a thickness of 1.0 mm or smaller even at its point light source portion. Subtracting a flexible printed board thickness of 0.2 mm therefrom, the point light source must be suppressed 0.8 mm or smaller in thickness. There are a variety of proposals on the thickness reduction for the surface light source device. However, in the method of thermal crimping by placing the point light source 2 within the light-conductor plate 6 as in the surface light source device 1 shown in FIG. 1, the region crimped is as thick as 0.3 mm. Excepting the thickness of the crimping region and the thickness of the flexible printed board 4, there is a need for a point light source to have a thickness of 0.5 mm or smaller. At present, the point light source of side emission is minimally 0.6 mm thick.

In a surface light source device 10 shown in FIG. 4, a recess 11 is formed in an outer peripheral surface of a light-conductor plate 6, to arrange a point light source 2 in a manner opposing to the recess 11. A reflective sheet 12 is bonded between an upper surface of the point light source 2 and the upper surface of the light-conductor plate 6 while a reflective sheet 12 is bonded also between the lower surface of the point light source 2 and the lower surface of the light-conductor plate 6.

With this method, the light, emitted from the point light source 2 to the above of the surface of the light-conductor plate 6 or to the below of the back surface of the light-conductor plate 6, can be reflected upon the reflective sheet 12 and guided to the light-conductor plate 6, as shown in FIG. 5, which improves light utilization efficiency. However, in this method, the point light source 2 and light-conductor plate 6 are not sufficiently aligned before bonding the reflective sheet 12. In case variations occur in the gap between the point light source 2 and the light-conductor plate 6 due to the variation in bonding the reflective sheet 12, there is a decrease in the light introduced into the light-conductor plate 6 thus lowering light utilization efficiency. Furthermore, because the reflective sheet 12 is bonded on the both surfaces of the light-conductor plate 6, the surface light source device 10 increases in thickness. In addition, components increase in the number.

Meanwhile, in a surface light source device 17 shown in FIG. 6, snap-formed fitting holes 19 partly cut away are previously provided in a flange 18 formed of an exterior resin of a point light source 2. As shown in FIG. 7, the flange 18 with the point light source 2 is fitted over the outer peripheral surface of the light-conductor plate 6 in a manner covering a region a recess 11 is formed. By elastically fitting the fitting holes 19 of the point light source 2 with the fitting pins 20 projecting on the both surfaces of the light-conductor plate 6, the point light source 2 is fixed. However, even on this surface light source device 17, where there occur variations in the gaps between the point light source 2 and the light-conductor plate 6 due to errors in the fitting holes 19 or fitting pins 20, the light introduced to the light-conductor plate decreases to lower the light utilization efficiency. Furthermore, because the flange 18 is laid over the both surfaces of the light-conductor plate 6, the surface light source device 17 increases in thickness.

Meanwhile, in a surface light source device 21 shown in FIG. 8, crimp holes 22 are previously opened in both sides of a point light source 2 as shown in FIG. 9. After inserting the crimp pins 23 projecting in an outer peripheral surface of the light-conductor plate 6 into the crimp holes 22 of the point light source 2, the crimp pins 23 are thermally crimped to thereby attach the point light source 2 to the light-conductor plate 6. However, in this surface light source device 21, a gap readily occurs at between the point light source 2 and the outer peripheral surface of the light-conductor plate 6 due to variations in thermal crimping. There is a problem that, if a gap occurs, light leaks through it thus lowering light utilization efficiency.

With the surface light source device of a structure attaching a point light source on the outer peripheral surface of light-conductor plate as above, there is a fear to cause a gap at between the point light source and the light-conductor plate, thus involving a problem that light leaks through the gap thus worsen the light utilization efficiency and wherein the structure is not resistive to impacts.

DISCLOSURE OF THE INVENTION

It is an object of the present invention to provide a slim-type surface light source device that, even in the case of attaching a light source to an outer surface of a light-conductor plate, the light source can be urged and fixed on the light-conductor plate in a manner not causing a predetermined gap or greater at between the light source and the light-conductor plate without increasing the thickness of the light-conductor plate.

A surface light source device according to the invention is characterized by comprising: a light-conductor plate that conducts light at an interior and allows the same to exit at a light-exit surface to an outside; and a light source arranged oppositely to a light incident surface of the light-conductor plate; the light source being held by a fixture engaged on the light-conductor plate, the fixture in part being elastically abutted against a surface of the light source opposite to the light conductor plate.

In the surface light source device of the invention, the light source is held by a fixture engaged on the light-conductor plate while the fixture at a part is elastically abutted against a surface of the light source opposite to the light conductor plate. Accordingly, the light source can be urged on the light incident surface of the light-conductor plate, thus preventing a required gap or greater from occurring at between the light incident surface of the light-conductor plate and the light source. Consequently, the light of the light source less leaks due to an increase of the gap between the light-incident surface of the light-conductor plate and the light source, thus improving the light utilization efficiency on the surface light source device. Moreover, the surface light source device can be reduced in thickness. Meanwhile, the use of the fixture improves the resistance to impacts upon attaching the light source and facilitates assembling of the surface light source device, thus lowering component cost.

Meanwhile, in an embodiment of a surface light source device of the invention, the light-emission window of the light source desirably has a height equal to or smaller than a thickness of the light-conductor plate. In case the light-emission window of the light source has a height equal to or smaller than a thickness of the light-conductor plate, the light emitted from the light source enters the interior of the light-conductor plate without leaking to an outside of the light source and light-conductor plate, thus improving the light utilization efficiency on the surface light source device.

Likewise, in another embodiment of a surface light source device of the invention, the fixture desirably has an exterior height equal to or smaller than a thickness of the light-conductor plate. In case the fixture has a height equal to or smaller than a thickness of the light-conductor plate, the fixture can not protrude from the upper or lower surface of the light-conductor plate, thus reducing the thickness of the surface light source device.

Likewise, in still another embodiment of a surface light source device of the invention, the fixture is featured having a shape symmetric in 180-degree-rotation about an attaching direction to the light-conductor plate. Accordingly, because the fixture is free of directivity in shape, there is no need to selectively arrange the upside/downside of the fixture upon attaching the fixture to the light source or the light-conductor plate, thus simplifying assembling process.

Meanwhile, in yet another embodiment of a surface light source device of the invention, the fixture may be removably fixed on the light-conductor plate. In case the fixture is is removable from the light-conductor plate, when the light source or the light-conductor plate is replaced or repaired, the fixture can be removed from the light-conductor plate to thereby separate the light source and the light-conductor plate. Meanwhile, the light source and the light-conductor plate can be assembled together by using again the same fixture. Accordingly, the fixture can be reused. In addition, the repairability of the surface light source device is improved.

In order to make the fixture removable, the fixture may be fixed on the light-conductor plate by recessing fixture-fit areas in upper and lower surfaces of the light-conductor plate, providing catches projecting in the fixture-fit areas, providing fit pieces in a ring form, an L-form or T-form in the fixture formed in a folded-double form, and putting the fit pieces on the fixture-fit areas into engagement on the catches, for example. In such a structure, because the fit piece of the fixture is merely engaged on the catch of the light-conductor plate, the fixture can be easily removed by disengaging the fit piece of the fixture from the catch. Meanwhile, because the fit piece is put in the fixture-fit area recessed in the light-conductor plate, the fit piece can be prevented from protruding from the light-conductor plate.

Otherwise, in order to make the fixture removable, the fixture may be fixed on the light-conductor plate by providing catches in a side surface of the light-conductor plate, and engaging, on the catches, the fit pieces in a ring form, an L-form or T-form provided in the fixture. Incidentally, the side surface of the light-conductor plate is not limited to the side surface of the light-conductor plate entirety but may be a side surface of an extended region in an outer peripheral surface of the light-conductor plate. In such a structure, because the fit piece of the fixture is merely engaged on the catch of the light-conductor plate, the fixture can be easily removed by disengaging the fit piece of the fixture from the catch. Meanwhile, because the fit piece is engaged on the catch at the side surface of the light-conductor plate, the fit piece can be made not protruding from the light-conductor plate by providing the height of the fit piece lower than the thickness of the light-conductor plate.

Meanwhile, in yet another embodiment of a surface light source device of the invention, the fixture may be fixed on the light-conductor plate by forming one of a crimp projection or crimp hole in any of a fixture-fit area recessed in an upper surface or a lower surface of the light-conductor plate, a side surface of the light-conductor plate and a front surface of the light-conductor plate, forming other of the crimp projection or the crimp hole in the fixture, and inserting the crimp projection in the crimp hole into crimping. In this form, the fixture is attached to the light-conductor plate by crimping the crimp projection. However, because the crimp projection or crimp hole on the light-conductor plate side is provided in any of the fixture-fit area recessed in the upper or lower surface of the light-conductor plate, the side surface of the light-conductor plate and the front surface of the light-conductor plate, the crimp projection, etc. does not protrude from the upper or lower surface of the light-conductor plate, thus reducing the thickness of the surface light source device.

Meanwhile, in yet another embodiment of a surface light source device of the invention, the fixture and the light-conductor plate may have aligning means for aligning the fixture and the light-conductor plate to each other thicknesswise of the light-conductor plate, the fixture and the light source having aligning means for aligning the fixture and the light source to each other thicknesswise of the light-conductor plate. According to the embodiment, because the light source and the light-conductor plate can be aligned with each other thicknesswise through the fixture, the light source can be prevented from deviating thicknesswise relative to the light-conductor plate thereby readily leaking light, thus improving the light utilization efficiency.

As means for aligning the fixture and the light-conductor plates there is a method of providing a thickness-reduced portion in a vicinity of the light incident surface of the light-conductor plate, and clamping the thickness-reduced portion by a pair of parallel protuberances provided in the fixture. According to this means, because the thickness-reduced portion of the light-conductor plate is clamped by the fixture, the fixture clamping the light-conductor plate does not increase in height, thus reducing the thickness of the surface light source device.

Meanwhile, as another means for aligning the fixture and the light-conductor plate, there is another method of forming one of a positioning projection or a positioning hole in any of a recess provided in an upper surface or an lower surface of the light-conductor plate, a side surface of the light-conductor plate and a front surface of the light-conductor plate, forming other of the positioning projection or the positioning hole in the fixture, and fitting the positioning projection in the positioning hole. According to this means, the positioning projection or the positioning hole does not protrude from the upper or lower surface of the light-conductor plate. Due to this, the fixture height can be provided within the thickness of the light-conductor plate, thus reducing the thickness of the surface light source device.

Meanwhile, as means for aligning the fixture and the light source, there is a method of providing a thickness-reduced portion at least in a part of the light source, and clamping the thickness-reduced portion by a pair of parallel protuberances provided in the fixture. According to this means, because the thickness-reduced portion of the light source is clamped by the fixture, the fixture clamping the light source does not increase in height, thus reducing the thickness of the surface light source device.

Meanwhile, as another means for aligning the fixture and the light source, there is a method of forming one of a positioning projection or a positioning hole in any of a recess provided in an upper surface or an lower surface of the light source, a side surface of the light source and a front surface of the light source, forming other of the positioning projection or the positioning hole in the fixture, and fitting the positioning projection in the positioning hole. According to this means, the positioning projection or the positioning hole does not protrude from the upper or lower surface of the light source. Due to this, the fixture height can be provided within the thickness of the light source, thus reducing the thickness of the surface light source device.

Meanwhile, as still another means for aligning the fixture and the light source, there is a method of forming a positioning slit in a back surface of the light source, and fitting a part of the fixture in the positioning slit. According to this means, the structure for fitting the fixture and light source together can be made small in thickness, thus reducing the thickness of the surface light source device.

Incidentally, the constituent elements explained above of the invention can be combined to a possible extent.

Figure 1A:
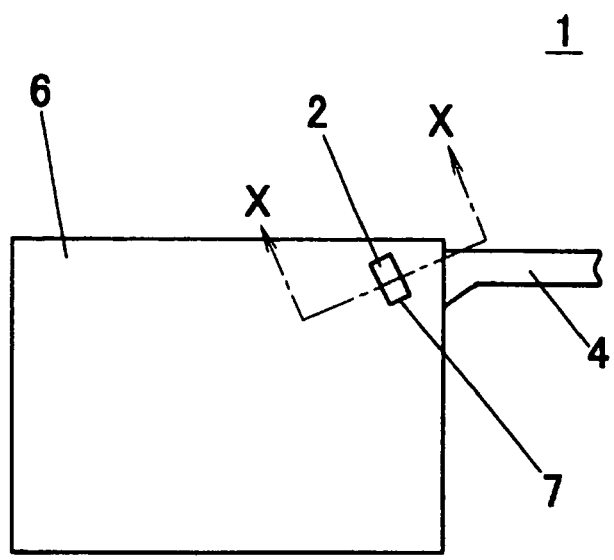
FIG. 1 (a) is a plan view showing a structure of a conventional surface light source device, (b) a cross-sectional view on line X-X in (a), and (c) a bottom view of the surface light source device.
Figure 1B:
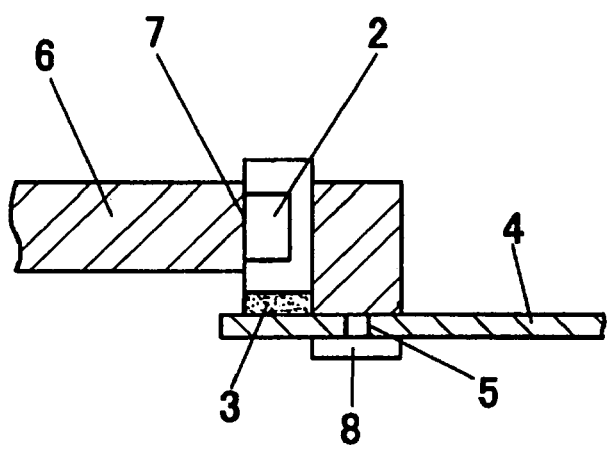
Figure 1C:
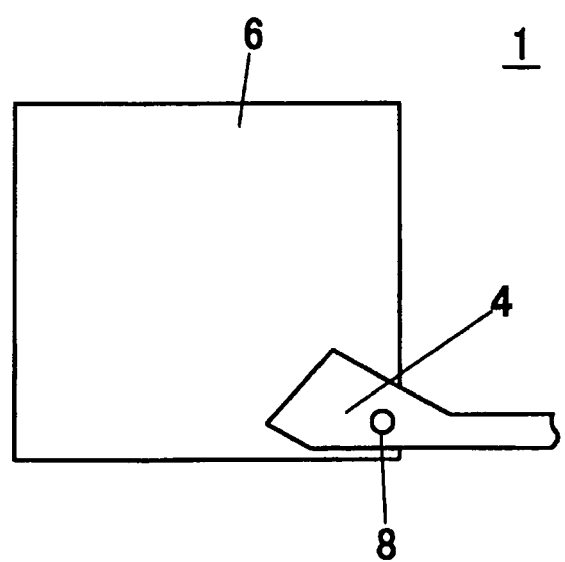
Figure 2:
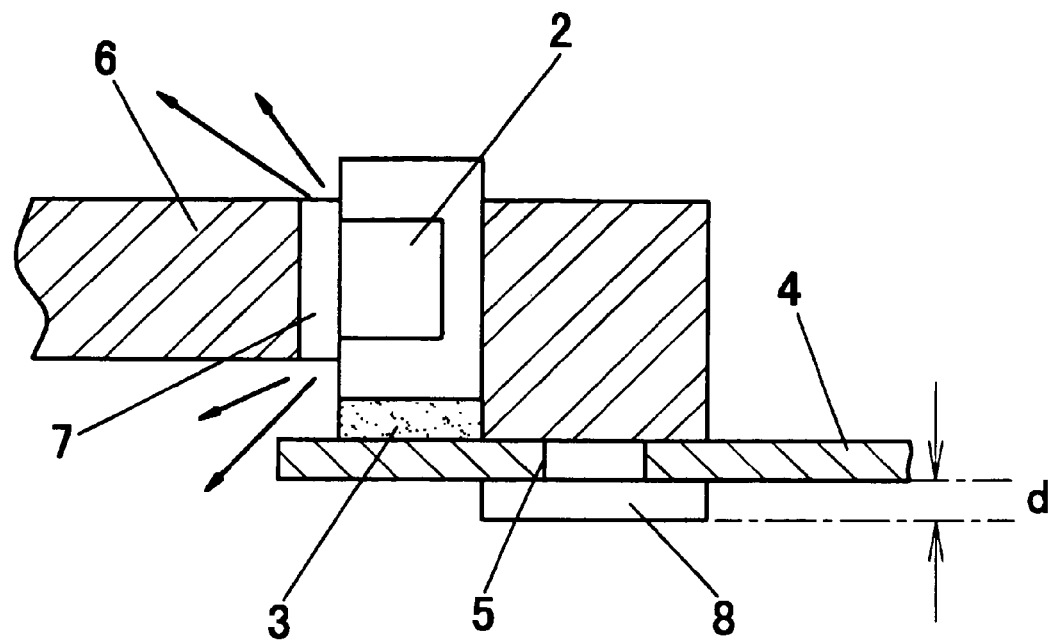
FIG. 2 is a magnifying cross-sectional view explaining the manner of light leak through a gap between a light-conductor plate and a point light source in the surface light source device.
Figure 3:
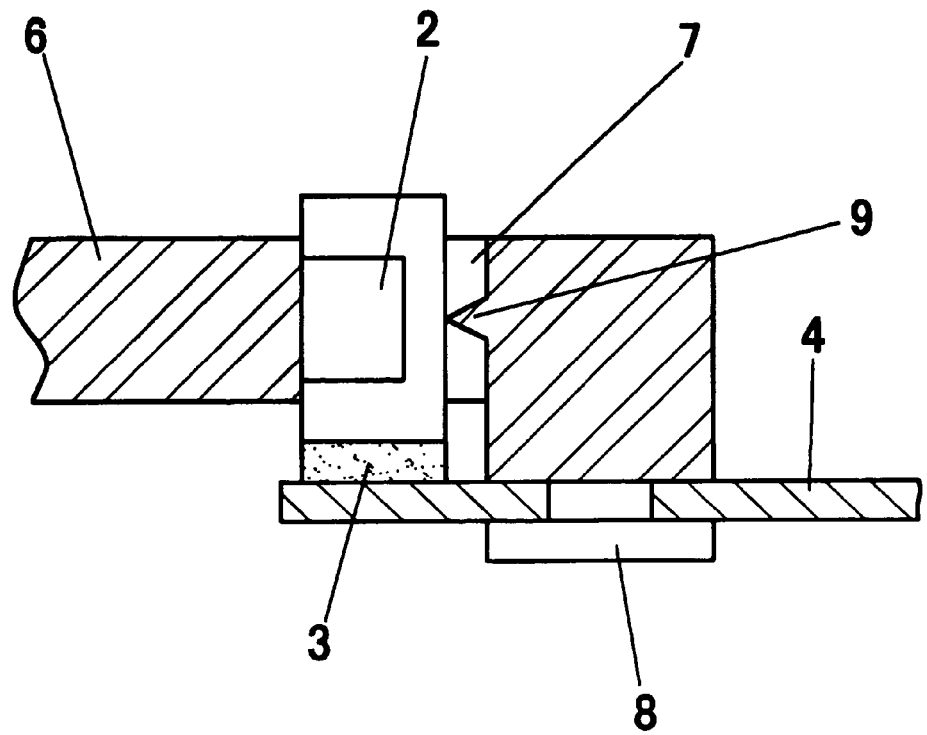
FIG. 3 is a magnifying cross-sectional view explaining a method to prevent a gap from occurring at between a light-conductor plate and a point light source in a conventional surface light source device.
Figure 4:
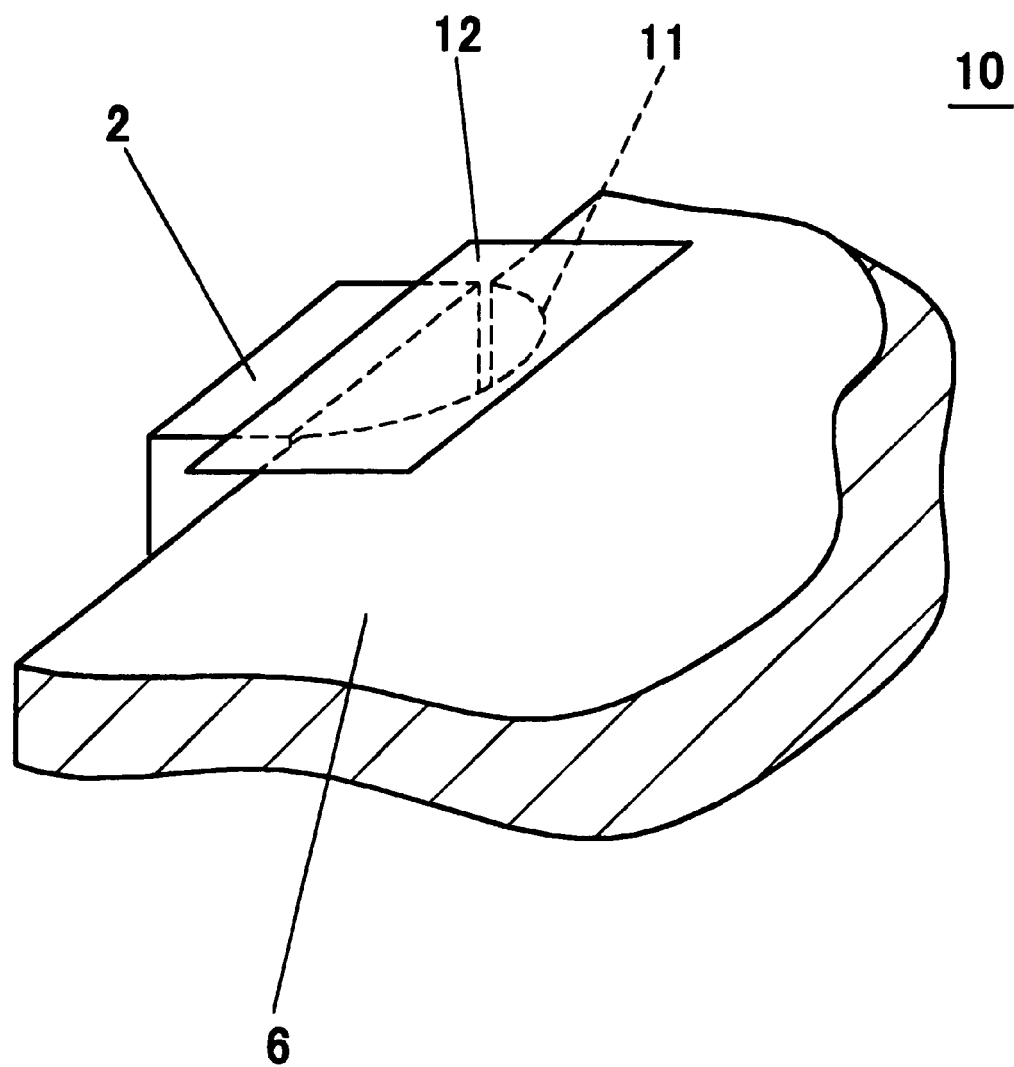
FIG. 4 is a perspective view showing a part of the conventional surface light source device having a point light source attached outside the light-conductor plate.
Figure 5:
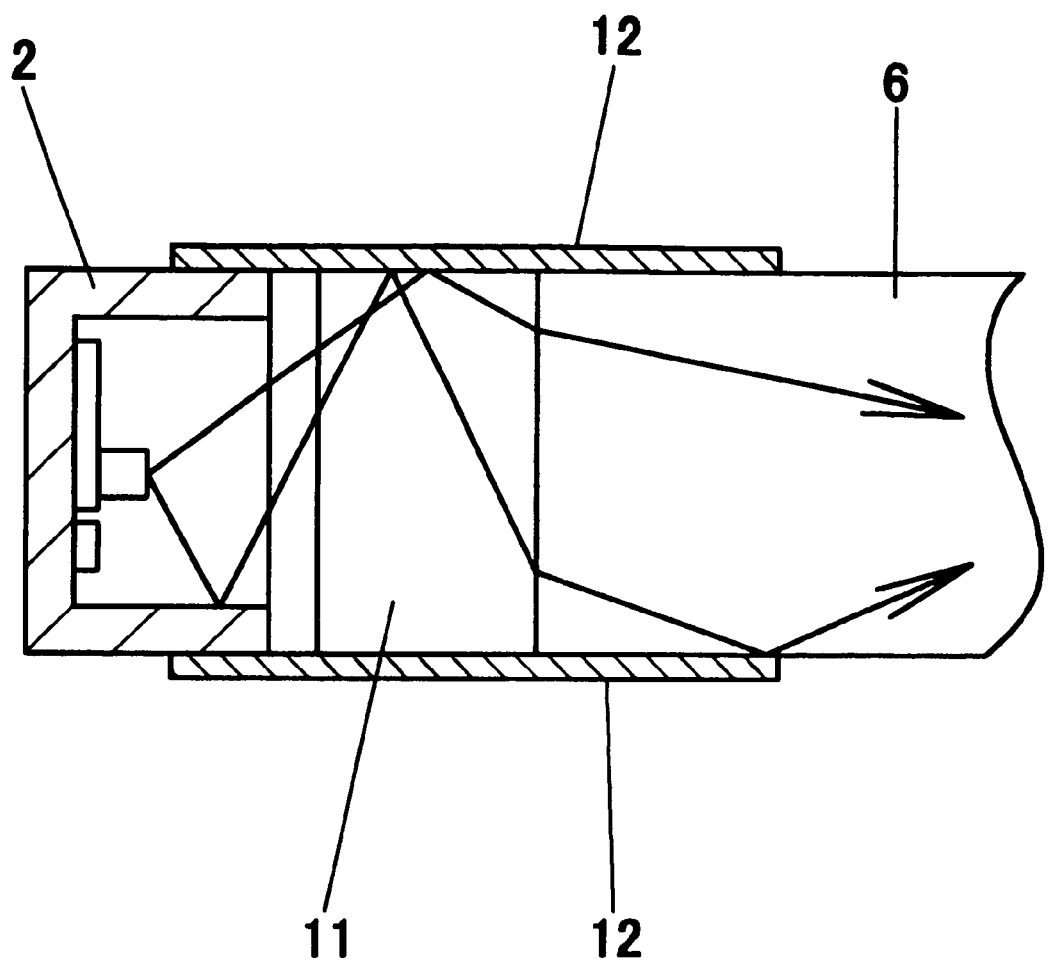
FIG. 5 is a cross-sectional view showing a part of the surface light source device.
Figure 6:
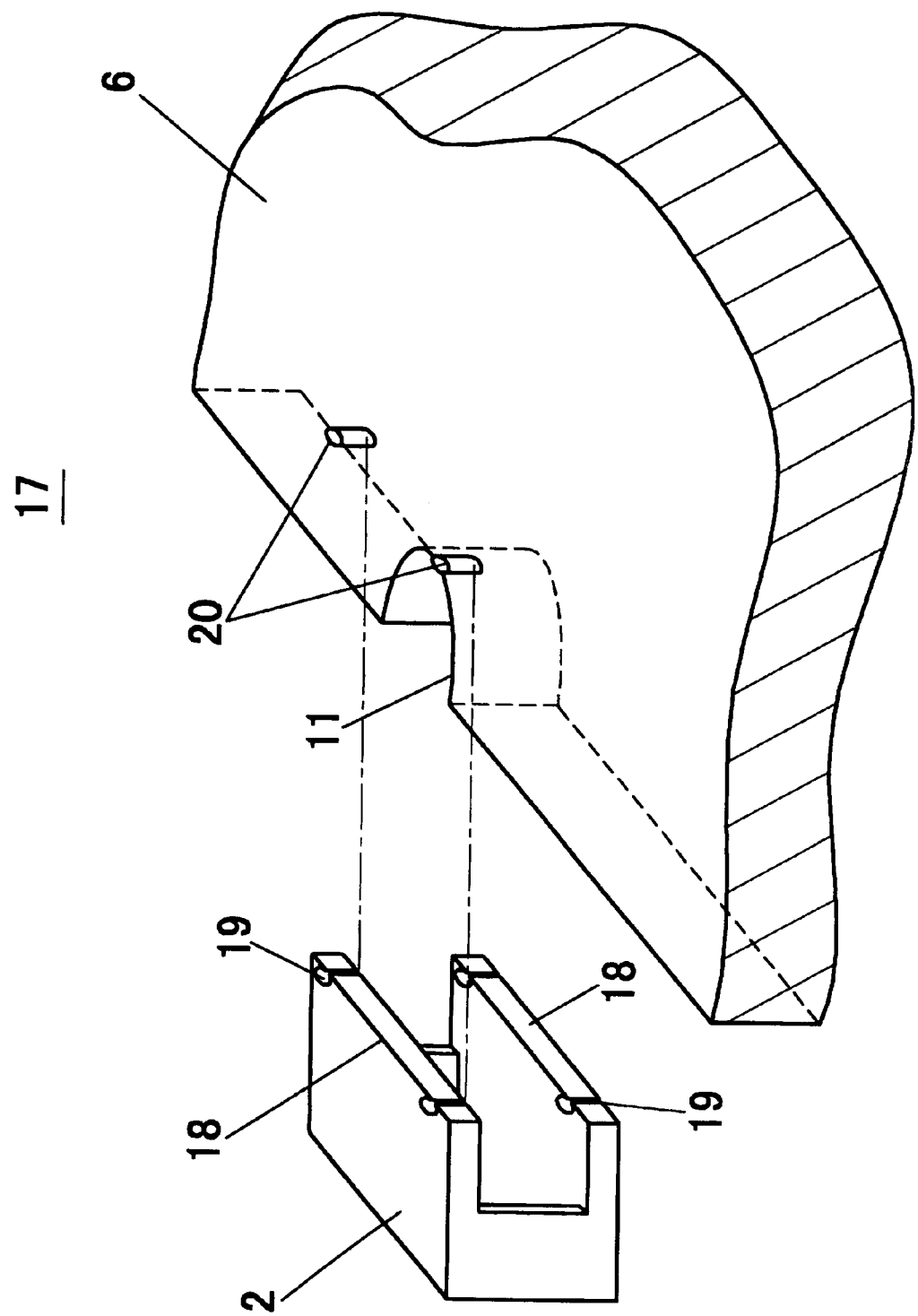
FIG. 6 is an exploded perspective view showing a part of another conventional surface light source device having a point light source attached outside the light-conductor plate.
Figure 7:
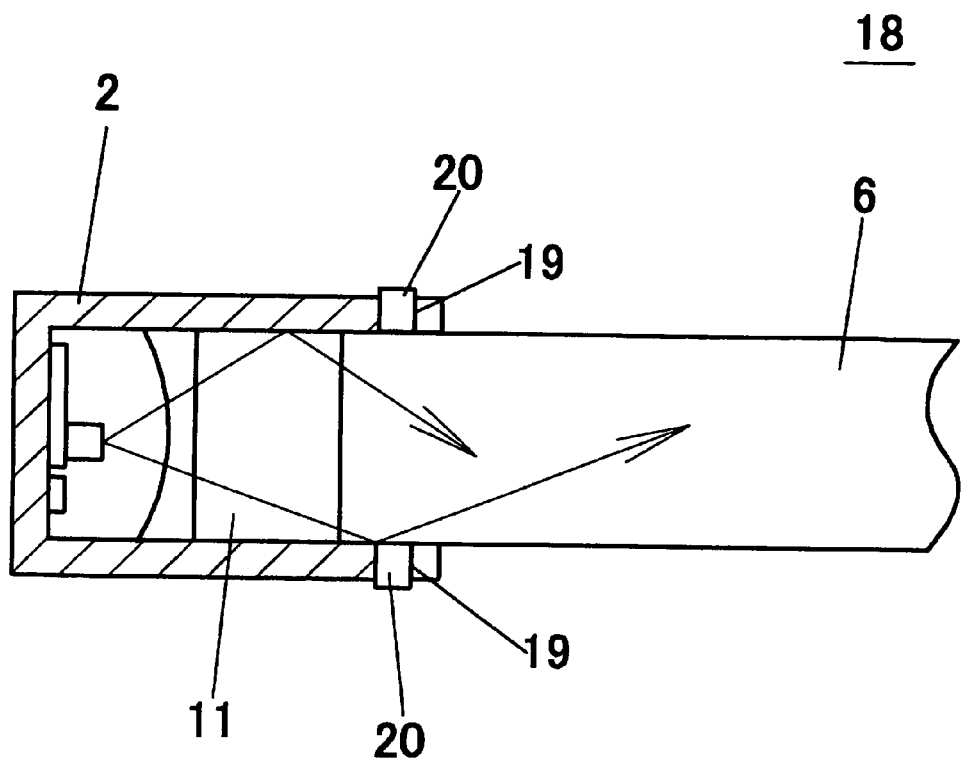
FIG. 7 is a cross-sectional view showing a part of the surface light source device.
Figure 8:
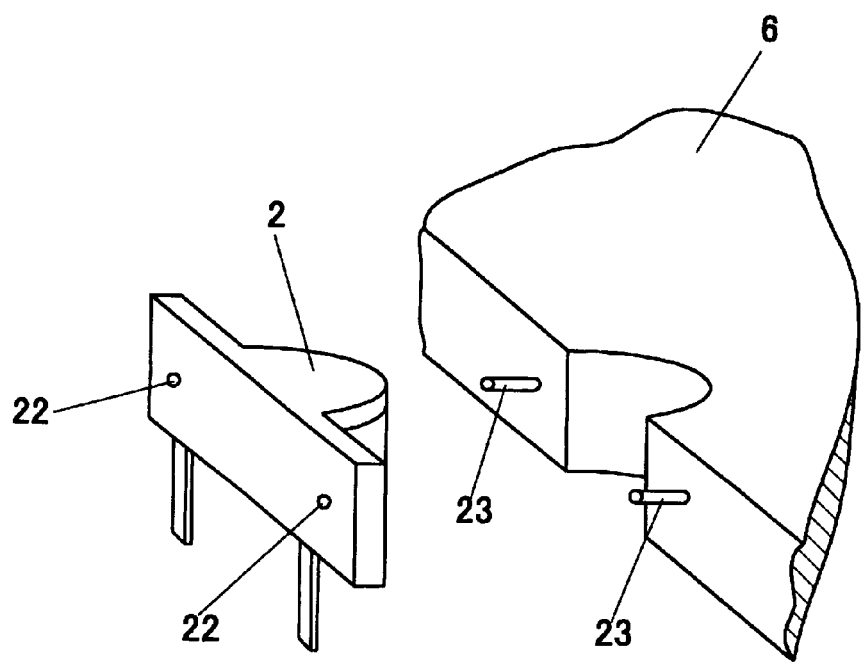
FIG. 8 is an exploded perspective view showing a part of still another conventional surface light source device having a point light source attached outside the light-conductor plate.
Figure 9:
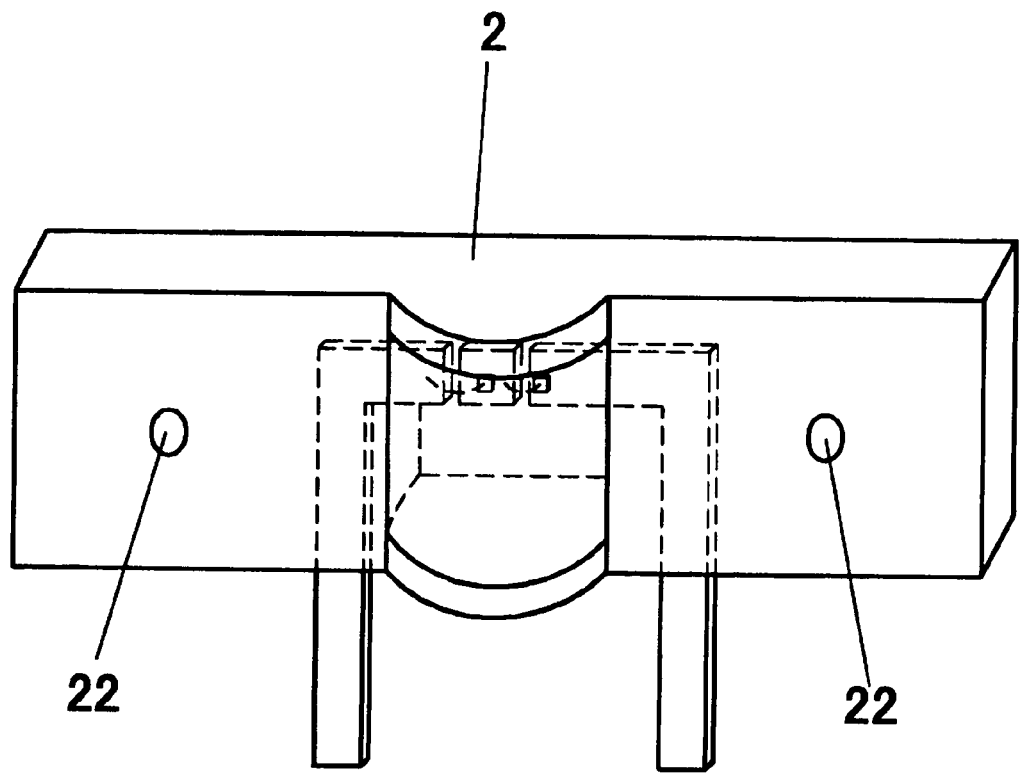
FIG. 9 is a perspective view of a point light source used on the surface light source device.

Incidentally, the major references used in the drawings are as follows.

31 surface light source device
32 point light source
33 light-conductor plate
35 light incident surface
41 projection
42 clamp step
43 push area
46 extended region
47 light-source receiver
48 projection
49 fixture-fit area
50 snap
51 clamp step
52 metal fixture
53 fit piece
54 engaging hole
55 clamp piece
56 abutment piece
61 crimp pin
63 positioning slit
64 positioning projection
65 crimp hole
66 positioning hole

BEST MODE FOR CARRYING OUT THE INVENTION

Hereunder, embodiments of the present invention will be explained in detail. Note that the invention is not limited to the following embodiments but, naturally, is to be modified within the scope not departing from the technical idea of the invention.

Embodiment 1

Figure 10:
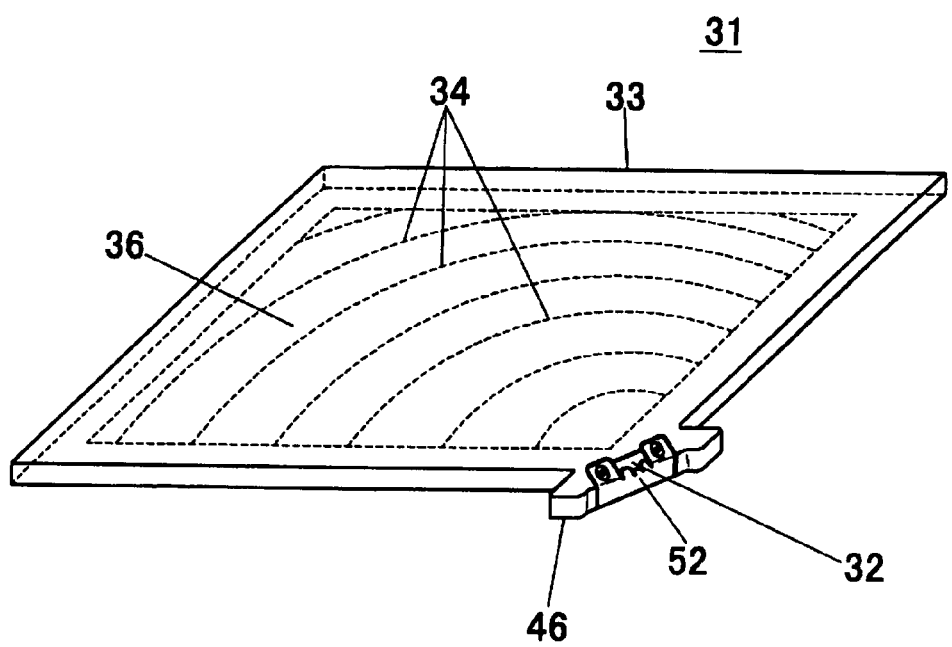
FIG. 10 is a schematic perspective view of a surface light source device according to embodiment 1 of the invention.

FIG. 10 is a schematic perspective view of a surface light source device 31 according to embodiment 1 of the invention. The surface light source device 31 is made up by a point light source 32 and a light-conductor plate 33. The point light source 32 is fixed on an outer peripheral corner of the light-conductor plate 33 rectangular in form by means of a metal fixture 52. In a lower surface of the light-conductor plate 33, there are recessed a plurality of polarization patterns 34 triangular in cross section. The polarization patterns 34 are arranged nearly concentric with spacing about a light-emission point of the point light source 32. Consequently, in case light is emitted from the point light source 32 incorporating therein a light emitting element such as an LED chip, the light from the point light source 32 enters the light-conductor plate 33 at a light incident surface 35 (see FIG. 12) of the light-conductor plate 33 opposed to the point light source 32, and spreads nearly throughout the light-conductor plate 33 while repeating total reflections within the light-conductor plate 33 at between its main and back surfaces. In case the light in the light-conductor plate 33 is incident upon the polarization pattern 34 in the course of propagation through the light-conductor plate 33, the light incident upon the polarization pattern 34 is totally reflected by the polarization pattern 34 toward the main surface while the light, incident upon the main surface of the light-conductor plate 33 at an angle smaller than a critical angle of total reflection, is allowed to exit the surface (at a light-exit surface 36) of the light-conductor plate 33. Here, the polarization patterns 34 have an arrangement in a density designed with a distance, etc. of from the point light source 32 such that the light exiting the light-exit surface 36 is nearly uniform in intensity throughout the effective region of the light-conductor plate 33.

Incidentally, in some cases, a reflective sheet, such as an Ag film or a white resin sheet, is arranged over the lower surface of the light-conductor plate 33 in order to return the light leaked through the back surface of the light-conductor plate 33 into the light-conductor plate 33. Meanwhile, a diffusive sheet maybe properly arranged over the upper surface of the light-conductor plate 33.

Figure 11:
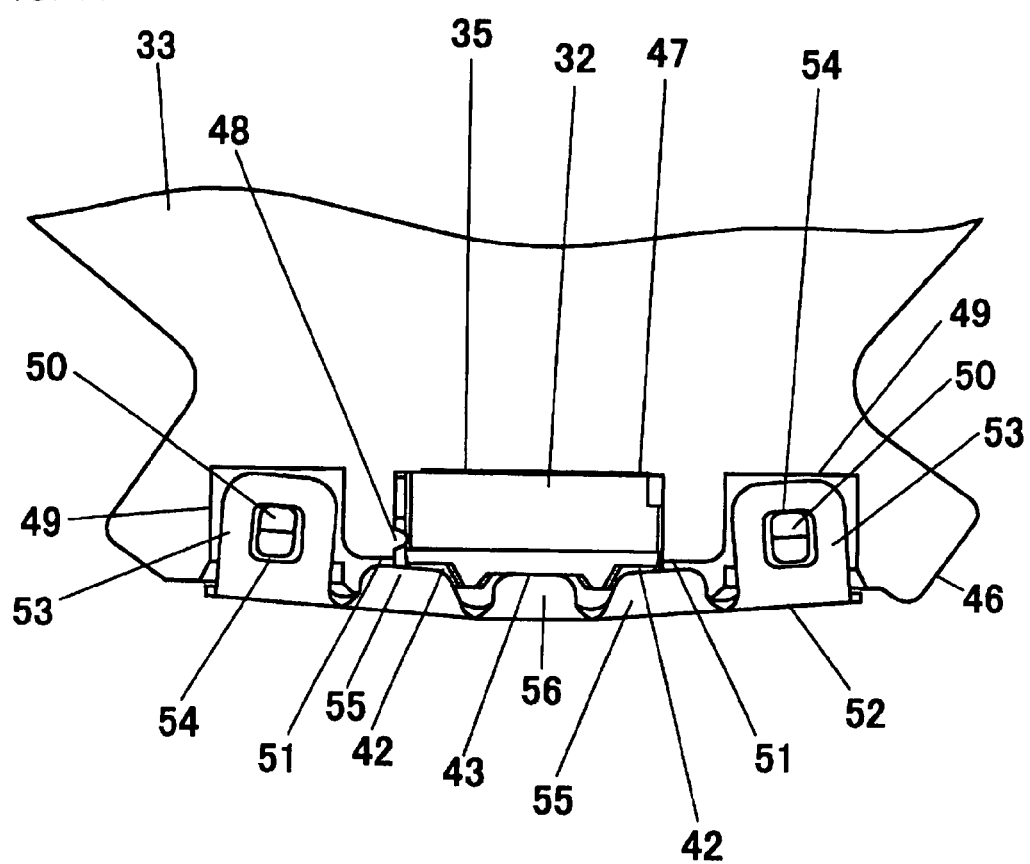
FIG. 11 is a plan view showing a structure of a region (extended region) where a point light source is attached, in the surface light source device.
Figure 13:
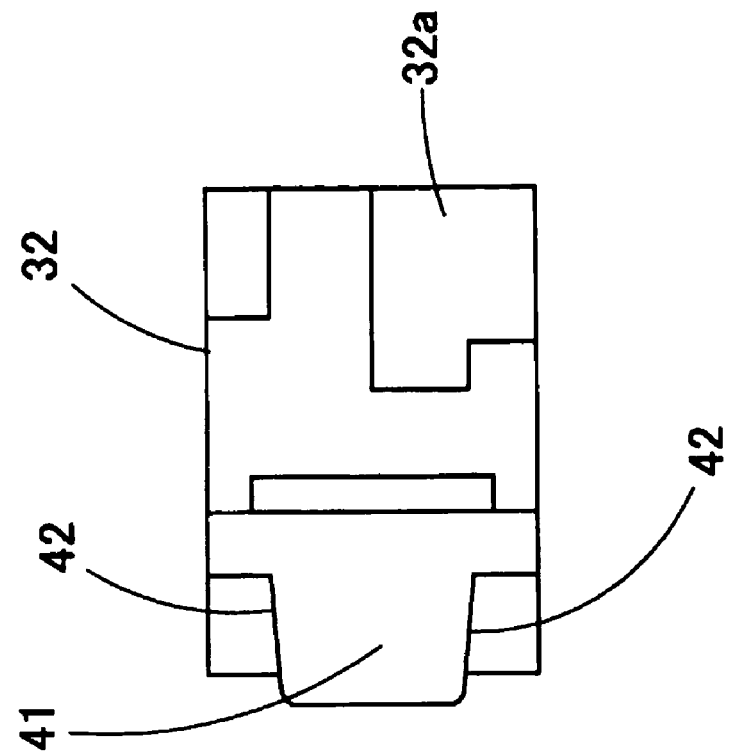
FIG. 13 is a side view of a point light source and metal fixture.
Figure 13:
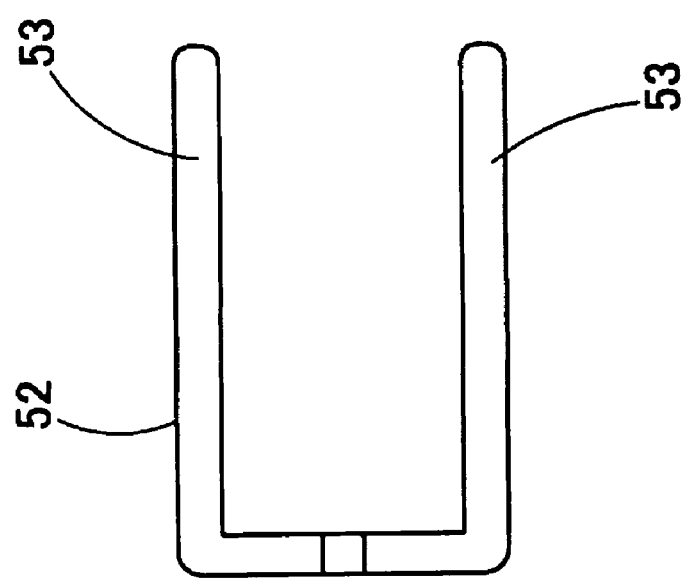
Figure 14:
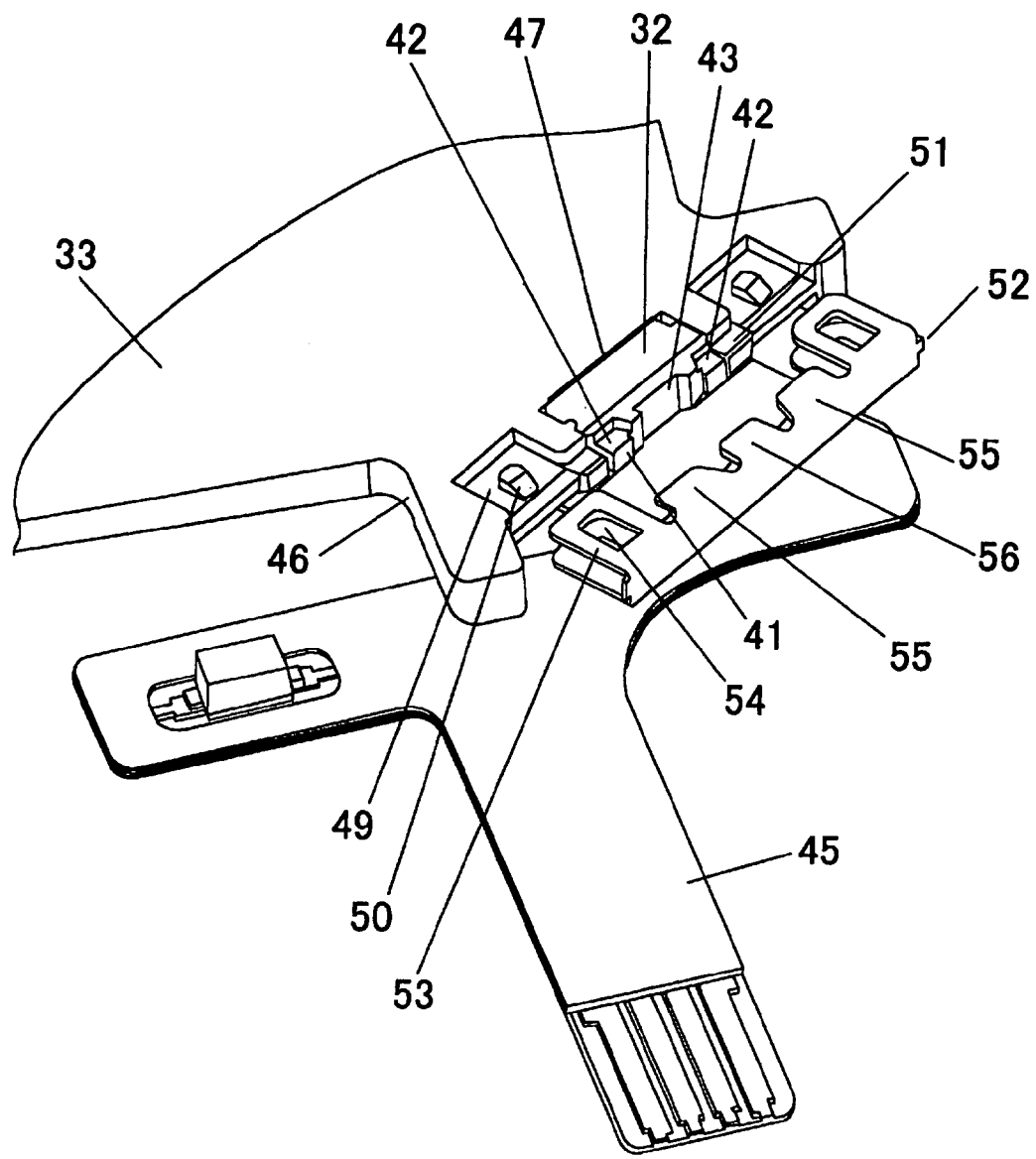
FIG. 14 is a perspective view, partly broken away, of a state the metal fixture is removed from the light-conductor plate, in the surface light source device of FIG. 10.
Figure 15:
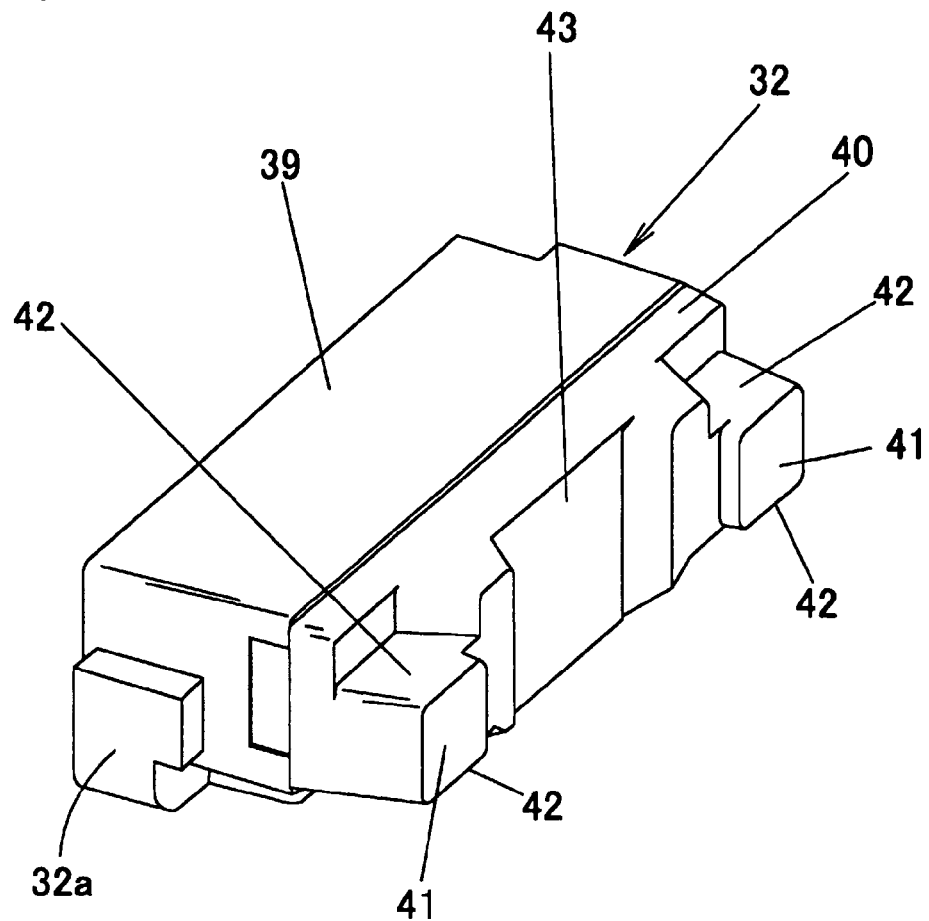
FIG. 15 is a perspective view, from back, of the point light source used on the surface light source device.
Figure 16:
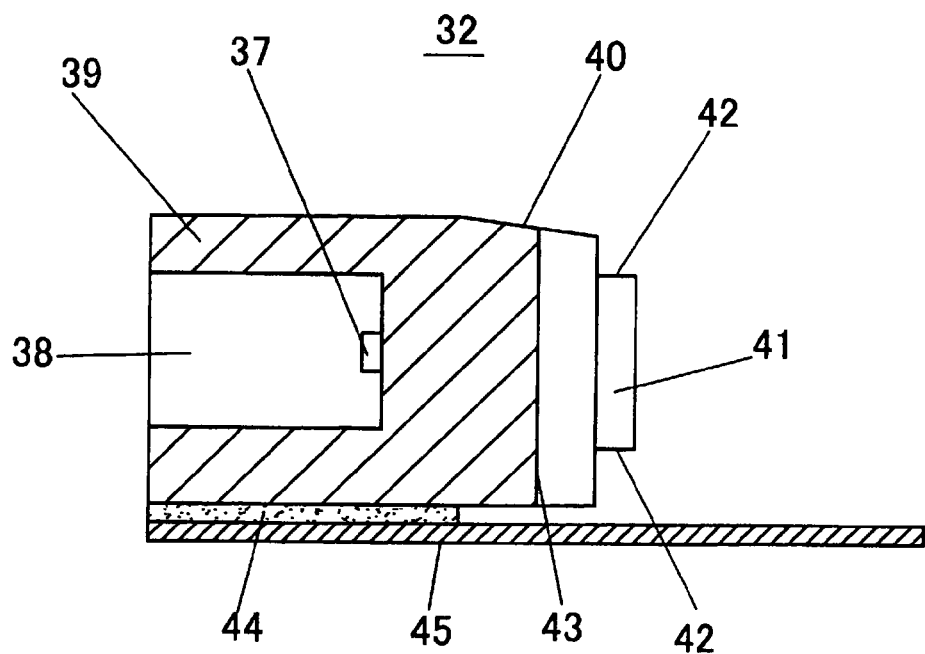
FIG. 16 is a cross-sectional view of the point light source.
Figure 17:
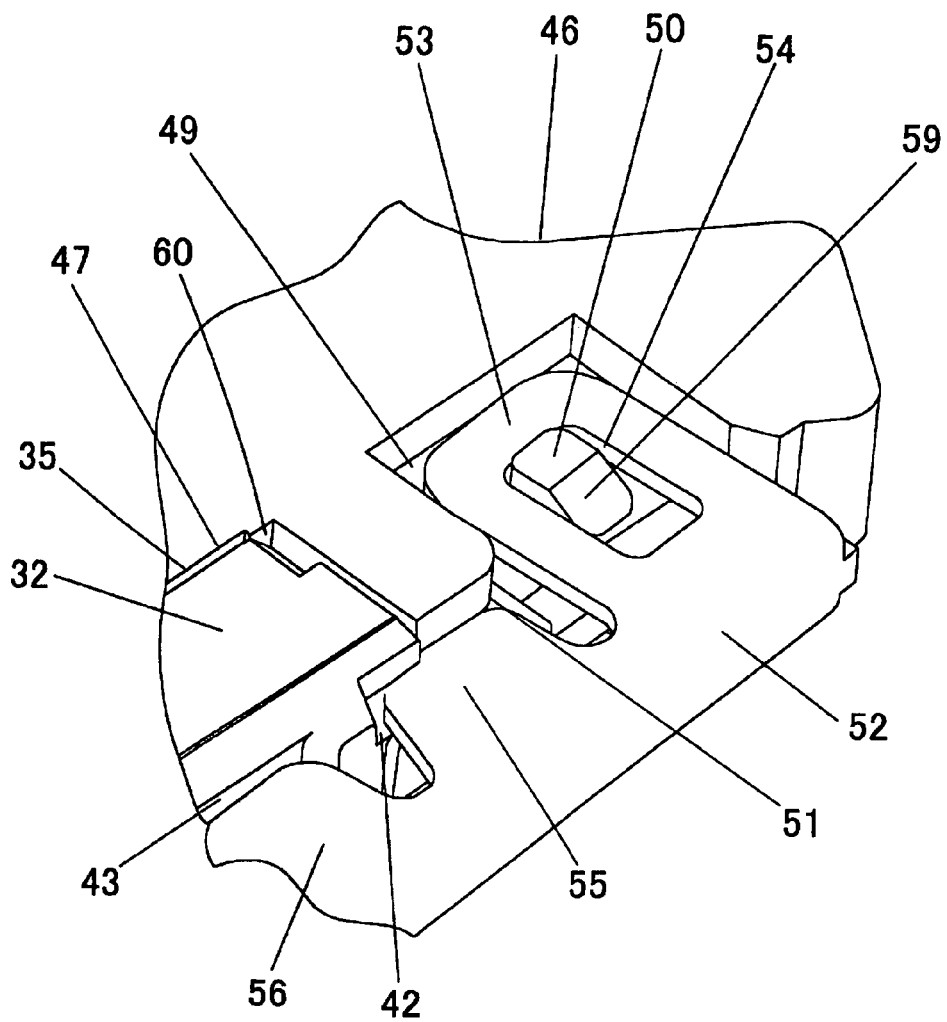
FIG. 17 is a magnifying perspective view, partly broken away, showing a state that a fit piece of a metal fixture is attached to a snap of the light-conductor plate.

Now, explanation is made on an attachment structure of the point light source 32 in the surface light source device 31. FIG. 11 is a plan view showing an attachment structure of the point light source 32 in the surface light source device 31, FIG. 12 an exploded plan view thereof, FIG. 13 a side view of the metal fixture 52 and point light source 32 as viewed laterally, FIG. 14 a perspective view of a state the metal fixture 52 is removed from the light-conductor plate 33. Meanwhile, FIG. 15 is a perspective view of the point light source while FIG. 16 is a cross-sectional view of the point light source. FIG. 17 is a magnifying perspective view, partly broken away, showing a state the metal fixture 52 is attached on the light-conductor plate 33.

The point light source 32 has a structure as shown in FIGS. 15 and 16. In the point light source 32, a light emitting element 37 such as an LED chip mounted on a stem (not shown) is encapsulated in a transparent resin 38. Furthermore, the transparent resin 38 is covered with a white exterior resin 39, in a region excepting its front surface so that the light emitted at the light emitting element 37 can exit only through a light-emission window, a transparent resin region at a part in front of the point light source 32. The exterior resin 39 is formed with a fixture engager 40 of resin, in a back surface thereof. The fixture engager 40 is provided, at its both sides, with projections 41 smaller in thickness than the exterior resin 39. The projection 41 has upper and lower surfaces the respective ones of which are receded relative to the upper and lower surfaces of the exterior resin 39, thus forming clamp steps 42. A push area 43 is recessed centrally in a backside of the fixture engager 40. As shown in FIGS. 16 and 14, the point light source 32 is mounted on a flexible printed board 45 by a solder 44. Note that reference 32a is a terminal for energizing to the point light source 32.

Figure 12:
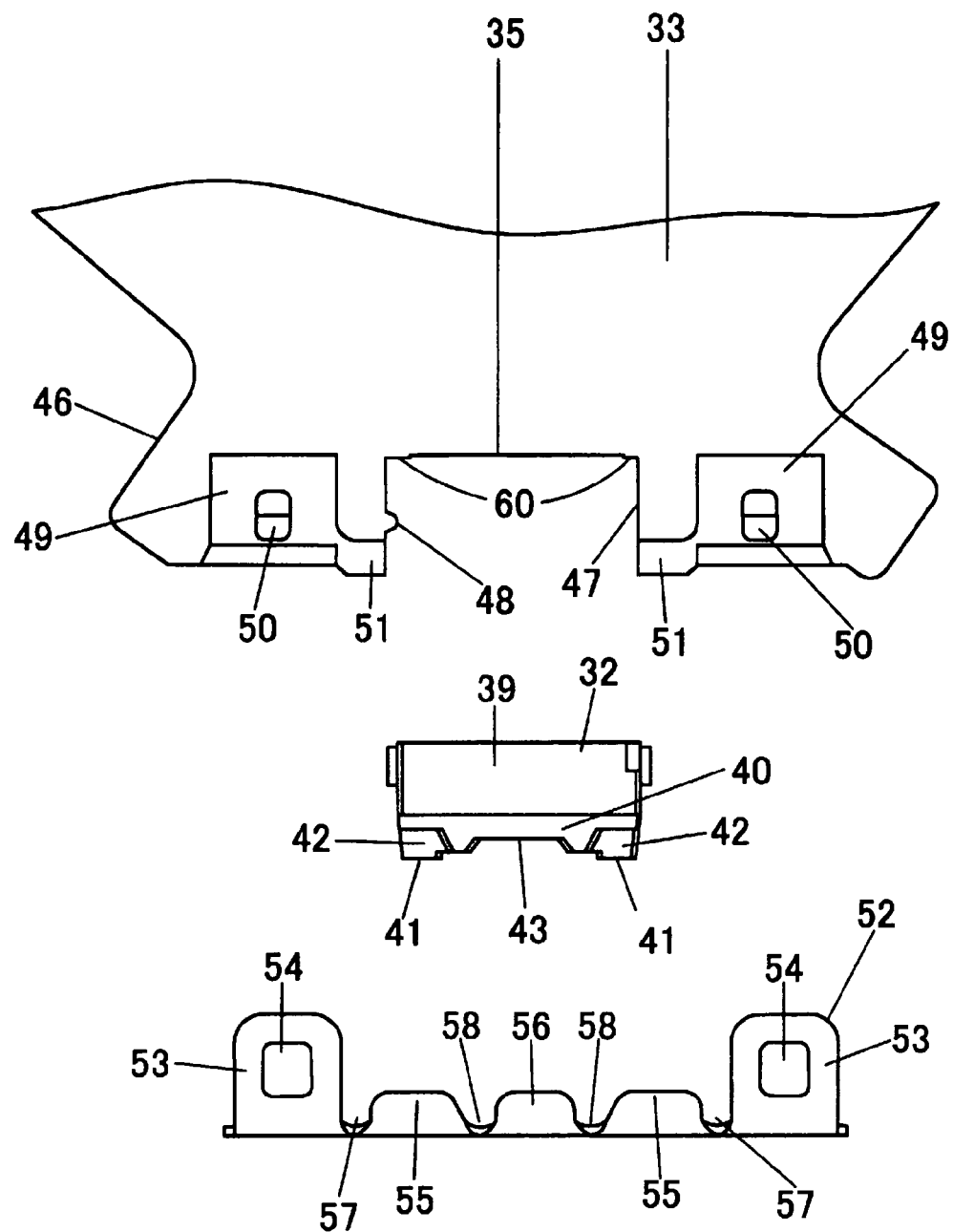
FIG. 12 is an exploded plan diagram of FIG. 11.

An extended region 46 is provided in the corner of the light-conductor plate 33. The extended region 46 protrudes in a diagonal direction of the light-conductor plate 33 and has a side nearly parallel with the direction orthogonal to the diagonal direction of the light-conductor plate 33. In a center of the extended region 46, a light-source receiver 47 is recessed nearly rectangular in form in a manner penetrating through between the both surfaces. Furthermore, as shown in FIG. 12, a light incident surface 35 slightly recessed is formed in a deep surface of the light-source receiver 47. In the light incident surface 35, a multiplicity of micro-prisms (not shown) are formed in order to introduce the light of from the point light source 32, at a wide angle, into the light-conductor plate 33. Furthermore, abutment surface 60 is provided protruding, against the point light source 32, on the both sides of the light incident surface 35 in order not to deform the micro-prisms due to hitting of the point light source 32 upon the light incident surface 35 after assembling. Meanwhile, in an inner peripheral side face of the light-source receiver 47, a projection 48 is provided in order to prevent the point light source 32 from chattering left and right due to an abutment thereof against a side surface of the point light source 32 put in the light-source receiver 47.

Meanwhile, on both sides of the light-source receiver 47, fixture-fit areas 49 are recessed respectively in the both surfaces of the extended region 46. Claw-formed snaps 50 (catches) project respectively in the fixture-fit area 49 in the left and right, main and back surfaces. The snap 50, at its rear half, is formed with a slant surface 59 formed slanted rearward. The snap 50 has a height smaller in dimensions than the depth of the fixture-fit area 49 so that the snap 50 does not project out of the surface of the light-conductor plate 33. Meanwhile, clamp steps 51 are formed in the both surfaces of the extended region 46, in areas between the light-source receiver 47 and the fixture-fit areas 49. Here, thickness is nearly equal to between the thickness-reduced portion of between the fixture-fit area 49 in the both surfaces and the thickness-reduced portion of between the clamp steps 51 in the both surfaces. Incidentally, the thickness-reduced portion of between the clamp steps 42, in the both surfaces of the point light source 32, has a thickness (thickness of the projection 41) also nearly equal to the thickness of the thickness-reduced portion between the fixture-fit area 49 and to the thickness of the thickness-reduced portion between the clamp steps 51.

Consequently, in case the point light source 32 is fit in the light-source receiver 47 of the light-conductor plate 33, the projection 48 abuts against the side surface of the point light source 32, to thereby align the point light source 32 left and right. This eliminates the chatter of the point light source 32 leftward and rightward. Meanwhile, the point light source 32 has a depth equal in dimensions to the depth of the light-source receiver 47 so that, when the point light source 32 is fit in the light-source receiver 47, the point light source 32 in part thereof (e.g. at the tip of the projection 41) is flush with the end face of the extended region 46 as shown in FIG. 14. Because the point light source 32 is fixed on the flexible printed board 45 by a solder 44 as noted before, fitting the point light source 32 in the light-source receiver 47 places the flexible printed board 45 into abutment against the lower surface of the light-conductor plate 33, thus making it impossible to remove the point light source 32 upward from the light-source receiver 47 and hence roughly aligning the point light source 32. In this state, the region, extending over from the fixture-fit area 49 to clamp step 51 of the light-conductor plate 33 and to the clamp step 42 of the point light source 32, has a thickness smaller than but nearly equal to the thickness of the light-conductor plate 33.

The point light source 32, fit in the light-source receiver 47 of the light-conductor plate 33, is fixed on the light-conductor plate 33 by the metal fixture 52. The metal fixture 52 is fabricated by blanking and then bending a metal material, e.g. a stainless steel sheet, a steel sheet or an aluminum sheet, having a shape symmetric upper and lower and left and right. The metal fixture 52 is folded double with spacing into a U-form in cross-section, which has a gap height of between the upper and lower halves equal to the thickness of the thickness-reduced portions between the both surfaces of the fixture-fit area 49, clamp steps 51 and clamp steps 42.

The metal fixture 52 is provided with fit pieces 53 in both ends of the upper and lower halves thereof. The fit piece 53 is opened with an engaging hole 54 in the form of a rectangular hole somewhat greater than the snap 50. A pair of clamp pieces 55 are provided between the left and right fit pieces 53 while a abutment piece 56 is provided between the clamp pieces 55. Furthermore, cutouts 57 are formed each between the fit piece 53 and the clamp piece 55 while cutouts 58 are formed each between the clamp piece 55 and the abutment piece 56. By thus proving the cutouts 57, 58, rigidity is reduced in the regions where the cutout 57, 58 are formed. The metal fixture 52 is made readily open thicknesswise of the light-conductor plate 33 by the provision of the cutouts 57, to be elastically bent at cutout 58 points.

The metal fixture 52 thus structured can be attached in a manner clamping the point light source 32 and extended region 46 at their both surfaces from back of the point light source 52 after fitting the point light source 32 in the light-source receiver 47 of the light-conductor plate 33. Namely, as shown in FIG. 17, the slant surface 59 is provided in the snap 50 at its rear part. Accordingly, the metal fixture 52 is attached in a manner clamping partly the point light source 32 and extended region 46 between the upper and lower pieces of the metal fixture 52. When the metal fixture 52 is pushed at its both ends, the fit piece 53 is vertically opened by the slant surface 59 of the snap 50 to thereby get over the snap 50, thereby engaging the snap 50 naturally in the engaging hole 54. The snap 50 has a vertical front face so that, once the snap 50 is engaged in the engaging hole 54, the fit piece 53 is caught by the snap 50 thus preventing the metal fixture 52 from being disengaged.

By thus attaching the metal fixture 52 to the light-conductor plate 33, the clamp pieces 55 of the metal fixture 52 clamp the main and back surfaces of the thickness-reduced portion between the clamp steps 51 of the light-conductor plate 33 and of the thickness-reduced portion between the clamp steps 42 of the point light source 32, thus aligning the point light source 32 thicknesswise (vertically) relative to the light-conductor plate 33. Specifically, the extended region 46 of the light-conductor plate 33 has a thickness (maximum thickness) of 0.8 mm while the point light source 32 also has a thickness (maximum thickness) of 0.8 mm.

Meanwhile, in the metal fixture 52 attached on the light-conductor plate 33, the abutment piece 56 at its tip is in abutment against the push area 43 wherein the metal fixture 52 is elastically bent in a bow form as shown in FIG. 11 so that the point light source 32 can be urged onto the abutment surface 60 by the abutment piece 56 due to an elastic reactive force of the metal fixture 52. Accordingly, even where there are variations in the size of the point light source 32 or the light-source receiver 47, the point light source 32 can be accurately attached to the light-conductor plate 33 without rattling. Moreover, attachment can be by a one-touch manner without the need to use an adhesive or performing thermal crimp. Meanwhile, because of a dry-type, there is no need of a cure time as required in using an adhesive. The metal fixture 52 is in a size not to protrude in the main or back surface of the light-conductor plate 33, similarly to the point light source 32. Specifically, the metal fixture 52 is fabricated in an exterior height of 0.6 mm by a stainless steel sheet having a thickness of 0.1 mm. The depth is 0.2 mm or more in the fixture-fit area 49, the clamp step 51 and the clamp step 42. Accordingly, the metal fixture 52 is receded by 0.1 mm relative to the surface of the light-conductor plate 33.

Therefore, according to the surface light source device 31 of the invention, assembling operation can be simplified for a surface light source device 31. Meanwhile, by attaching the metal fixture 52, etc. in a manner not to protrude in the main or back surface of the light-conductor plate 33, the surface light source device 31 can be reduced in thickness, particularly decreased down to 0.8 mm or smaller in thickness. Furthermore, cost can be rendered low. Meanwhile, the metal fixture 52 can be fixed on the upper and lower surfaces of the light-conductor plate 33. By elastically urging the point light source 32 onto the light-conductor plate 33 through the metal fixture 52, the point light source 32 is positively fixed on the light-conductor plate 33 thus improving the impact resistance for the surface light source device 31.

Figure 18:
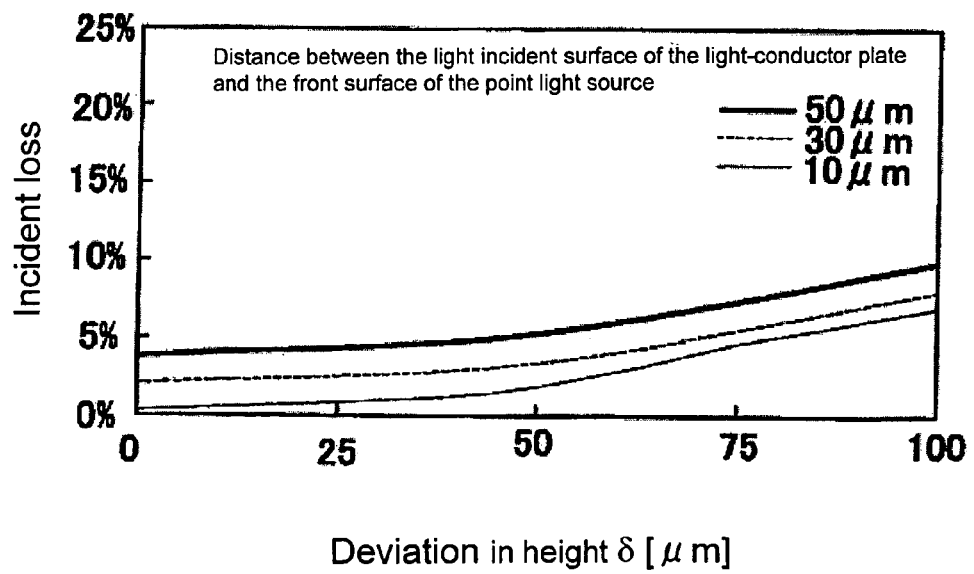
FIG. 18 is a figure showing a relationship between a positional deviation δ in a height direction of the point light source and light-conductive plate, and an incident loss thereof.

FIG. 18 is a figure showing a characteristic of between a deviation of between a center of light-conductor plate 33 in a height direction and a center of light-emission window in a height direction (hereinafter, referred to as positional deviation of point light source 32 in height) δ and an incident loss, where the light-emission window has a height (transparent resin 38 height) of 0.7 mm and the light-conductor plate 33 has a thickness of 0.7 mm, wherein characteristics are shown for the cases that the gap is 50 μ, 30 μ and 10 μ at between the light incident surface 35 of the light-conductor plate 33 and the front surface of the point light source 32. In this manner, the incident loss of the light emitted-from the point light source 32 increases with an increase of height positional deviation δ of point light source 32. Meanwhile, in case a variation occurs in the gap size between the light incident surface 35 of the light-conductor plate 33 and the point light source 32, incident loss also varies. As the gap increases due to variation, the incident loss upon the light-conductor plate 33 increases.

According to the surface light source device 31 of the invention, by utilizing the elasticity of the metal fixture 52, the point light source 32 can be urged on the abutment surface 60 of the light-conductor plate 33 in a manner free of a gap (although, in this embodiment, no close contact is provided because of forming prisms in the light incident surface 35, close contact can be provided where prisms are not provided). Moreover, because the point light source 32 is gripped by the metal fixture 52 to accurately align the point light source 32 and light-conductor plate 33 thicknesswise, the light emitted from the point light source 32 less leaks to the outside of the light-conductor plate 33 thus enabling to reduce the incident loss and to improve the light utilization efficiency on the surface light source device 31 using the point light source 32. Furthermore, because the point light source 32 is aligned within the dimensional range of the wall thickness of the light-conductor plate 33 as noted above, the height positional deviation δ of the point light source 32 is reduced to reduce the incident loss.

Meanwhile, according to a method of attaching the point light source 32 to the light-conductor plate 33 by use of the metal fixture 52 in this manner, where replacing or repairing the point light source 32 or the light-conductor plate 33, by flexing the fit piece 53 of the metal fixture 52 and removed it from the snap 50, the metal fixture 52 can be easily released to remove the point light source 32 from the light-conductor plate 33. Then, by using the same metal fixture 52, the replaced or repaired point light source 32 and light-conductor plate 33 can be assembled into the former. Where the point light source 32 is attached by an adhesive or thermal crimp, once the point light source 32 is removed from the light-conductor plate 33, the relevant point light source 32 and light conductor plate 33 cannot be reused. This recycle nature provide a merit of the invention, contributing to resource saving.

Figure 19:
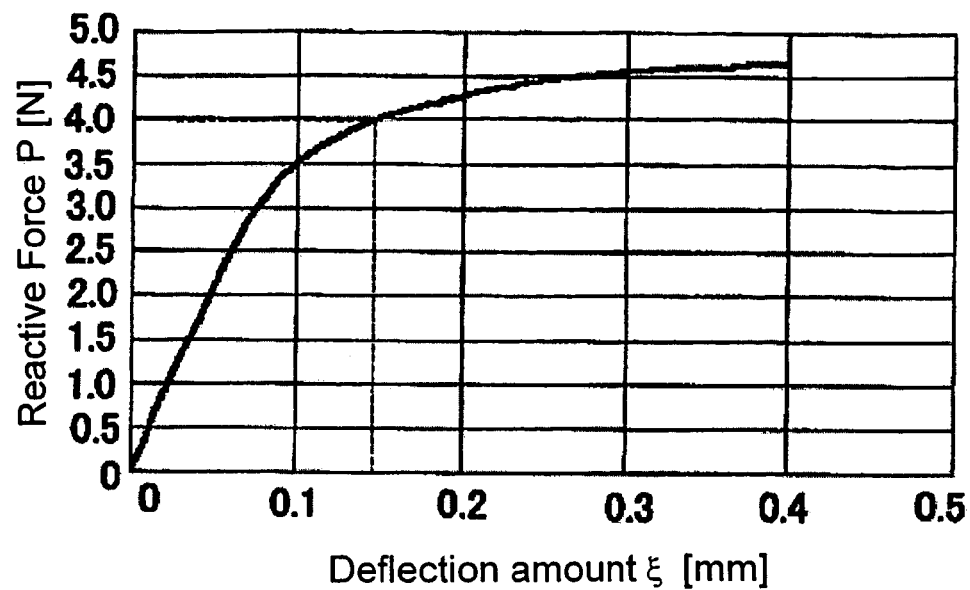
FIG. 19 is a figure showing a relationship between a deflection amount of the metal fixture ξ and a magnitude of its reactive force P.
Figure 20:
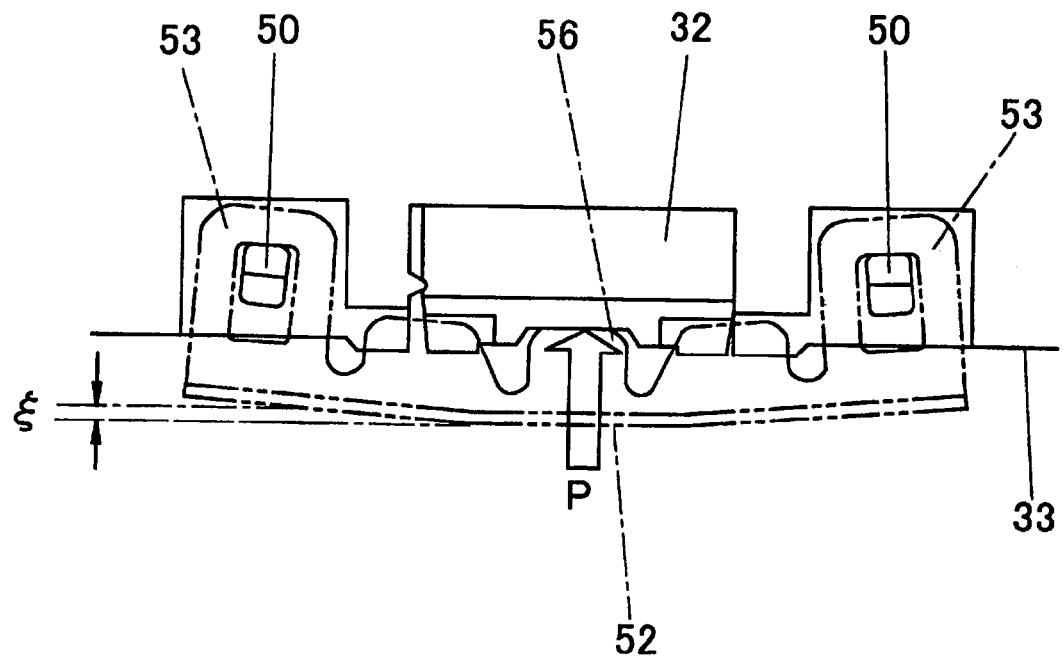
FIG. 20 is a figure explaining a deflection amount of the metal fixture ξ and a magnitude of its reactive force P.

FIG. 19 is a figure showing a relationship between a deflection amount ξ of the metal fixture 52 and the magnitude of a reactive force P thereof. This data is based on the measurement of a reactive force P, i.e. an urge force of the abutment piece 56, upon a deflection in an amount of ξ at a central portion of a metal fixture 52 wherein the metal fixture 52 is made by a stainless steel sheet having a thickness of 0.1 mm, as shown in FIG. 20. For the surface light source device 31 in the above embodiment, urge force P was 4N at a deflection amount ξ of 0.15 mm. The relationship between a reactive force P and a deflection amount ξ can be adjusted by the depth of the cutout 58.

Meanwhile, although, in the above embodiment, the metal fixture 52 was bent by abutting the abutment piece 56 against the point light source 32, the metal fixture 52 may be elastically bent by abutting a tip of the projection 41 against the metal fixture 52.

Figure 21:
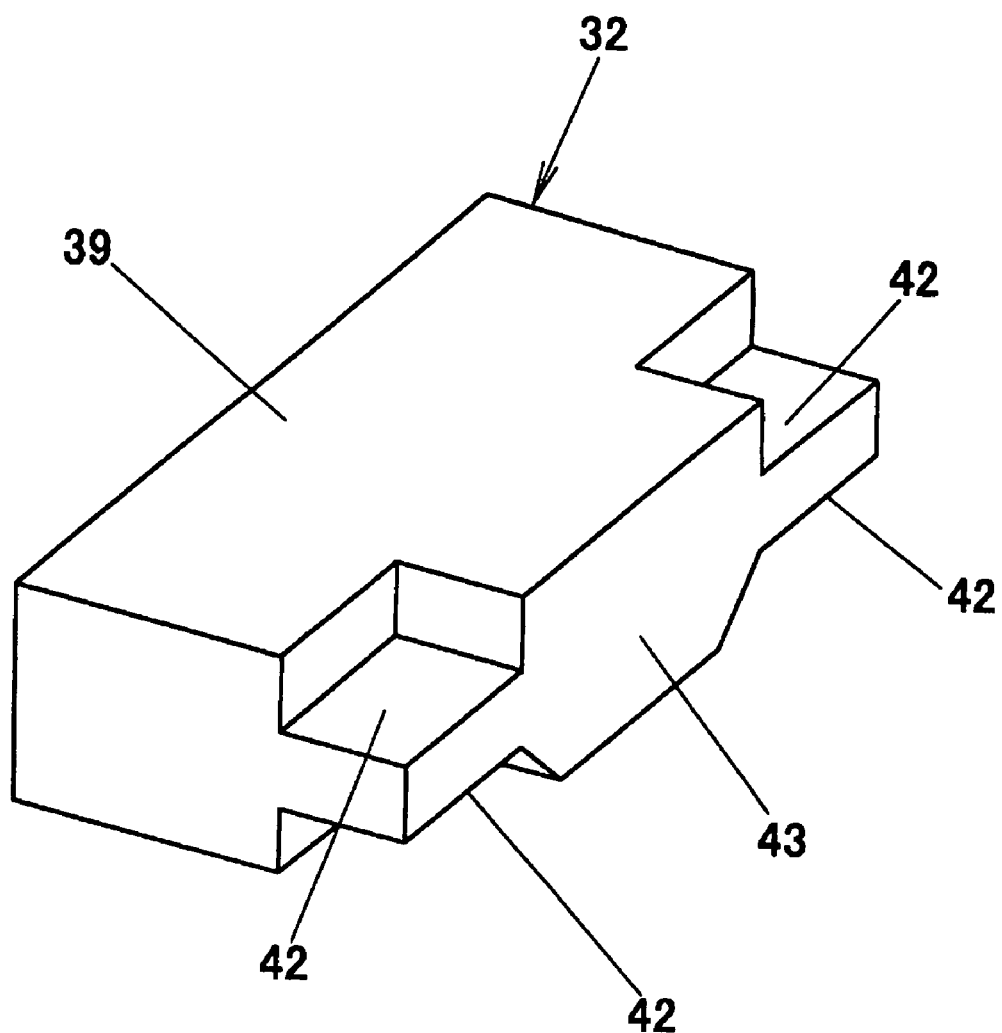
FIG. 21 is a perspective view showing a different shape of a point light source to be used in the embodiment.

Meanwhile, the point light source for use in the above embodiment may use one in a simplified form as shown in FIG. 21.

Embodiment 2

Figure 22:
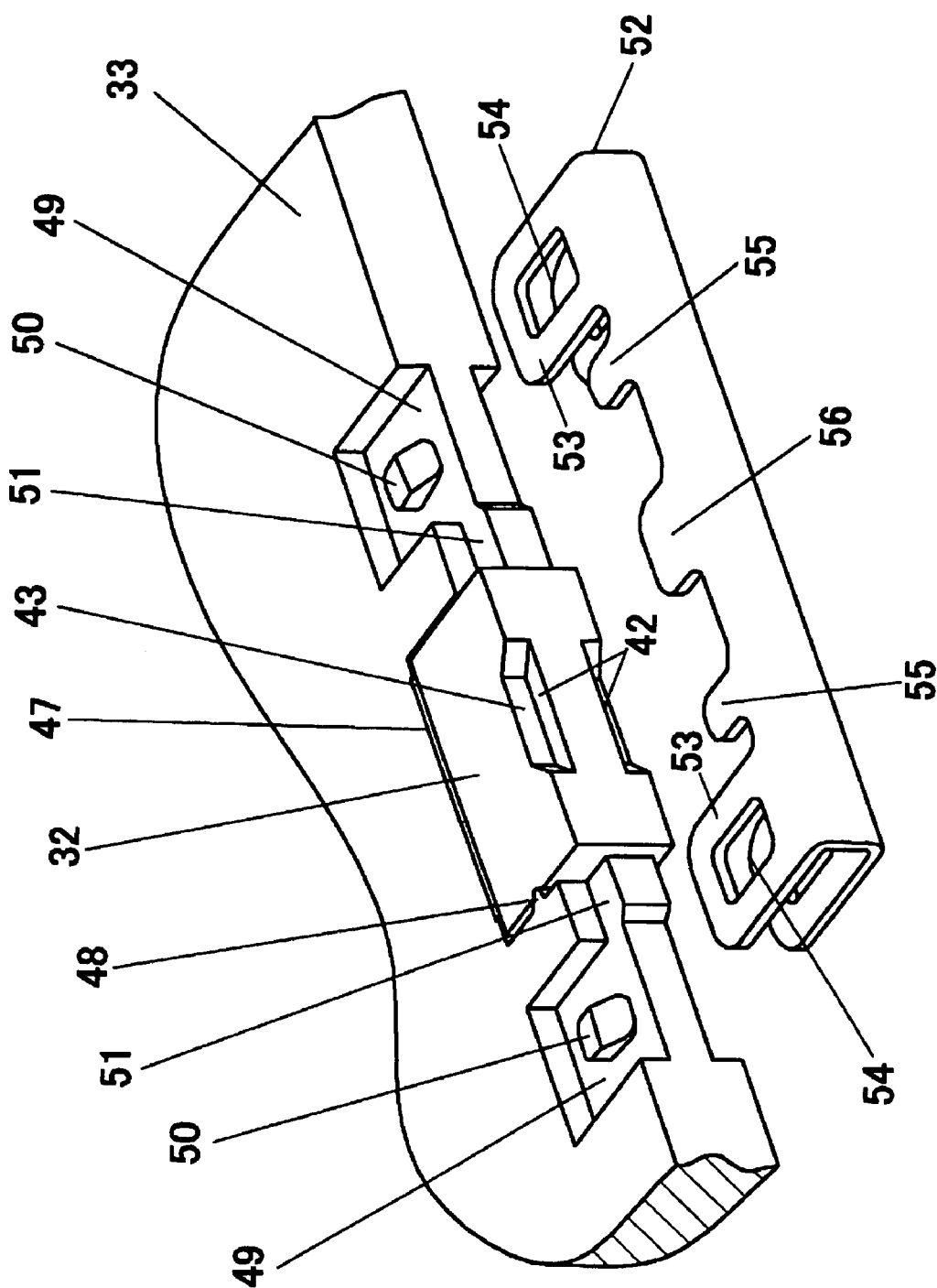
FIG. 22 is an exploded perspective view showing, with magnification, a part of a surface light source device according to embodiment 2 of the invention.
Figure 23:
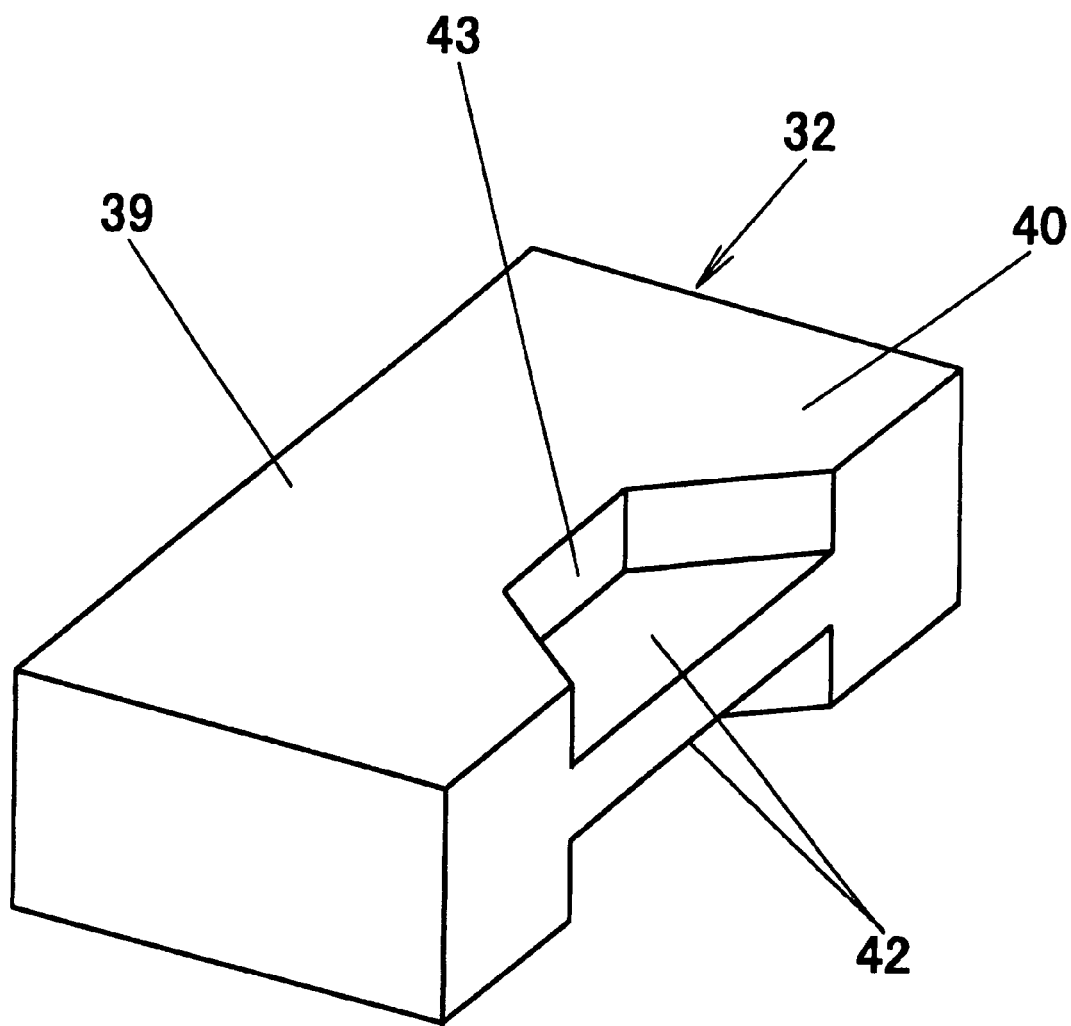
FIG. 23 is a perspective view of a point light source used on the surface light source device.

FIG. 22 is an exploded perspective view showing, with magnification, a part of a surface light source device according to embodiment 2 of the invention. FIG. 23 is a perspective view of a point light source 32 used for the surface light source device. In this embodiment, clamp steps 42 are formed centrally in the upper and lower surfaces in a backside of the point light source 32, and a push area 43, against which the abutment piece 56 of the metal fixture 52 is to be abutted, is formed in a deep surface of the clamp step 42. The light-conductor plate 33 has an extended region 46 having a structure similar to that of embodiment 1. Meanwhile, the metal fixture 52 has clamp pieces 55 made matched to the width of the clamp step 51 and hence narrower in width than those of embodiment 1. Meanwhile, because the upper and lower abutment pieces 56 are to clamp the thickness-reduced portion of between the clamp steps 42 of the point light source 32 and to abut at their tips against the push area 43, the thickness-reduced portion of point light source 32 between the clamp steps 42 has a thickness equal to a distance of between the inner faces of the abutment pieces 56.

Consequently, after putting the point light source 32 in a light-source receiver 47 of the light-conductor plate 33, the metal fixture 52 is attached onto the point light source 32 and extended region 46 from the back of the point light source 32. The thickness-reduced portion, of light-conductor plate 33 between the clamp steps 51, is clamped and gripped by the clamp pieces 55 while the thickness-reduced portion, of point light source 32 between the clamp steps 42, is clamped by the abutment pieces 56, thereby vertically aligning the point light source 32 relative to the light-conductor plate 33 through the metal fixture 52. Then, when the metal fixture 52 is pushed at its both sides forward, the snap 50 engages in the engaging hole 54 of the fit piece 53 whereby the fit pieces 53 is caught by the snap 50. At this time, the abutment piece 56 at its tip abuts against the push area 43 of the point light source 32, and the metal fixture 52 is elastically bent in a bow form. By the elastic reactive force, the point light source 32 is urged on the abutment surface 60 of the light-conductor plate 33.

In this embodiment, the point light source 32 and the light-conductor plate 33 are gripped by separate portions of the metal fixture 52. Meanwhile, the abutment piece 56 of the metal fixture 52 serves both to grip the point light source 32 and urge the point light source 32 on the light incident surface 35. Meanwhile, in also this embodiment, the metal fixture 52 is put in the fixture-fit area 49, clamp step 51 of the light-conductor plate 33 and in the clamp step 42 of the point light source 32, not to protrude from the upper and lower surfaces of the light-conductor plate 33, thus achieving the thickness reduction for the surface light source device.

Embodiment 3

Figure 24:
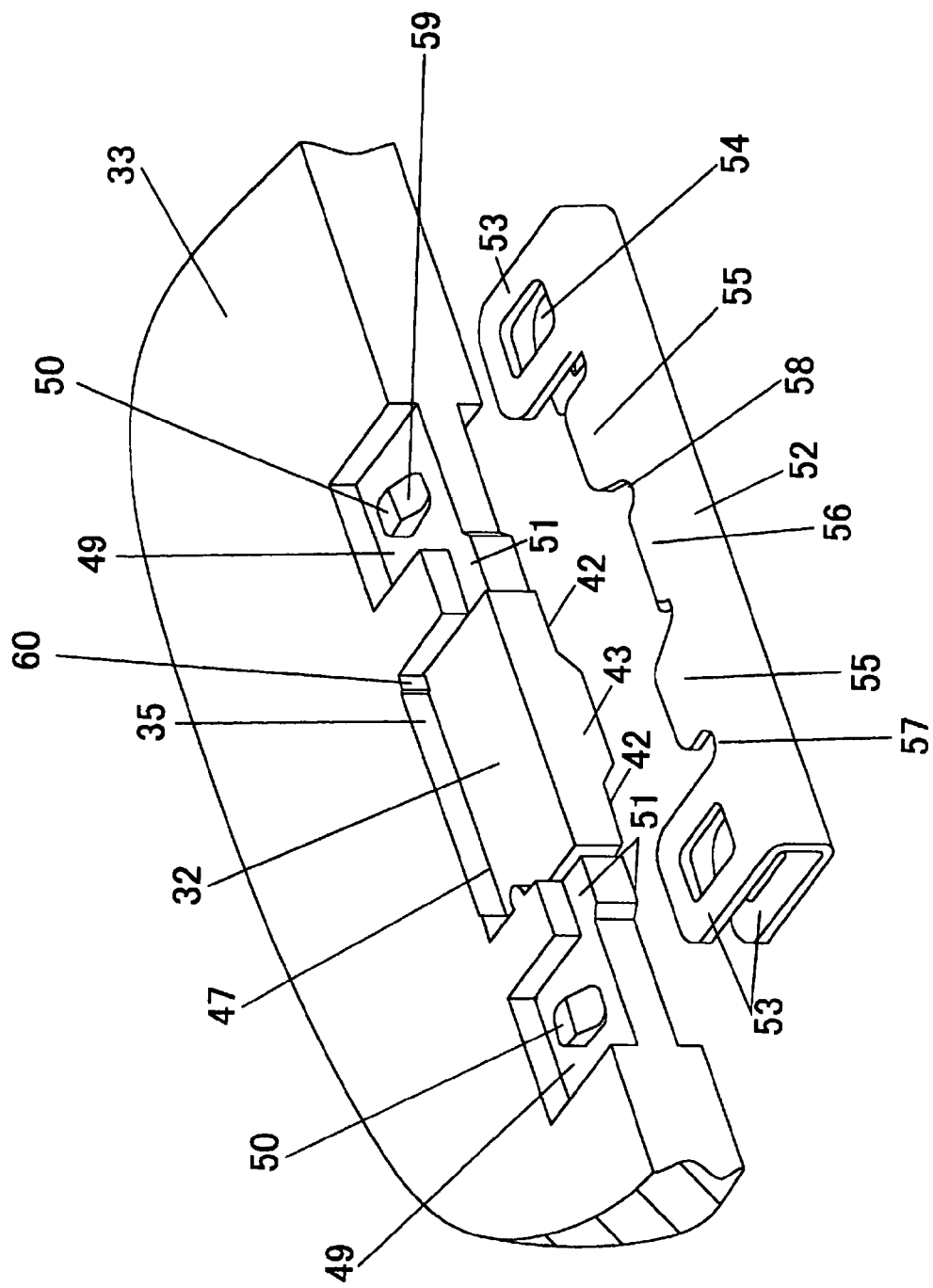
FIG. 24 is an exploded perspective view showing, with magnification, a part of a surface light source device according to embodiment 3 of the invention.
Figure 25:
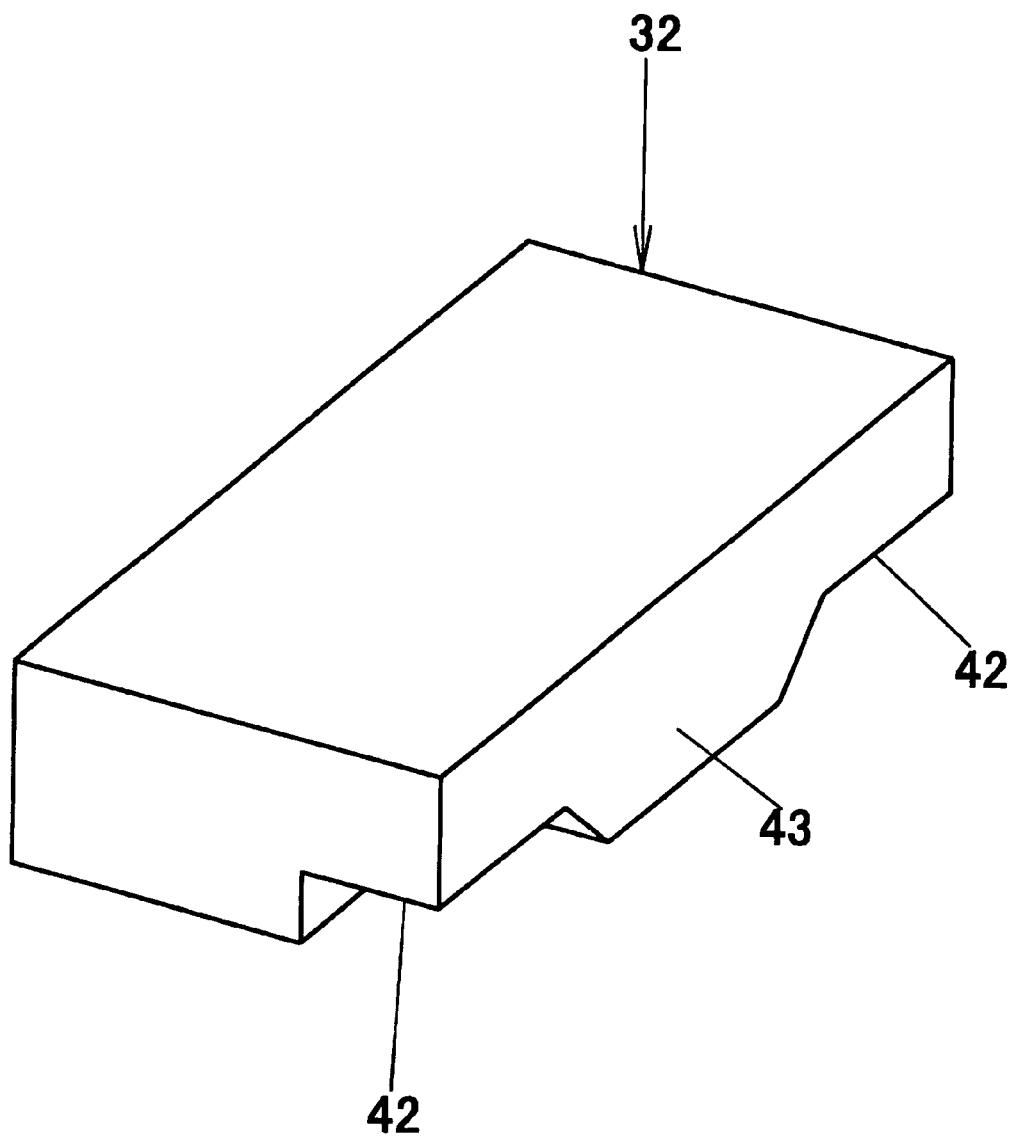
FIG. 25 is a perspective view of a point light source used on the surface light source device.

FIG. 24 is an exploded perspective view showing, with magnification, a part of a surface light source device according to embodiment 3 of the invention. FIG. 25 is a perspective view of a point light source 32 used for the surface light source device. In this embodiment, the point light source 32 is made low in its upper surface entirety by the same depth as a fixture-fit areas 49 and clamp steps 51. The point light source 32 is formed, at both sides of its lower surface, with clamp steps 42 in the same depth as the depth of the fixture-fit area 49 and clamp steps 51. Namely, this embodiment uses the point light source 32 that is a thin type. For example, provided that the light-conductor plate 33 has a thickness 0.8 mm and the clamp step 51 has a depth 0.2 mm, the point light source 32 has a thickness 0.6 mm and the clamp step 42 has a depth 0.2 mm. When the point light source 32 is put in a light-source receiver 47, the upper-side clamp step 51 and the point light source 32 are flush at their upper surfaces while the lower-side clamp step 51 and the clamp step 42 of the point light source 32 are flush at their lower surfaces.

The light-conductor plate 33 has an extended region 46 having a structure similar to that of embodiment 1. Although the metal fixture 52 also has a structure similar to that of embodiment 1, the abutment pieces 56 are bent inward so that the light emitting element 37 within the point light source 32 can be pushed in its position.

Consequently, after putting the point light source 32 in the light-source receiver 47 of the light-conductor plate 33, in case the metal fixture 52 is attached onto the point light source 32 and extended region 46 from back of the point light source 32, the clamp pieces 55 clamp and hold the thickness-reduced portion of light-conductor plate 33 between the clamp steps 51, the upper surface of and thickness-reduced portion between the clamp steps 42 of the point light source 32, thereby vertically aligning the point light source 32 relative to the light-conductor plate 33 by means of the metal fixture 52. Then, in case the metal fixture 52 is pushed at its both sides forward, the snaps 50 engage in the engaging holes 54 of the fit pieces 53 whereby the fit piece 53 is caught by the snap 50. At this time, the abutment piece 56 at its tip abuts against a backside central region of the point light source 32, and the metal fixture 52 is elastically bent in a bow form. By the elastic reactive force, the point light source 32 is urged on the light incident surface 35 of the light-conductor plate 33.

In case the point light source 32 can be reduced in thickness as in this embodiment, the clamp steps 42 of the point light source 32 can be provided in any one of the upper and lower surfaces. Furthermore, in case the point light source 32 can be reduced in thickness, it can be used in a form (rectangular) as it is without forming recesses for clamp steps 42 in the point light source 32, which can cope with the thin-type point light source 32. However, because the point light source 32 at its lower surface is mounted on a flexible printed board 45, this embodiment is reduced in the thickness only at the upper surface side.

Figure 26:
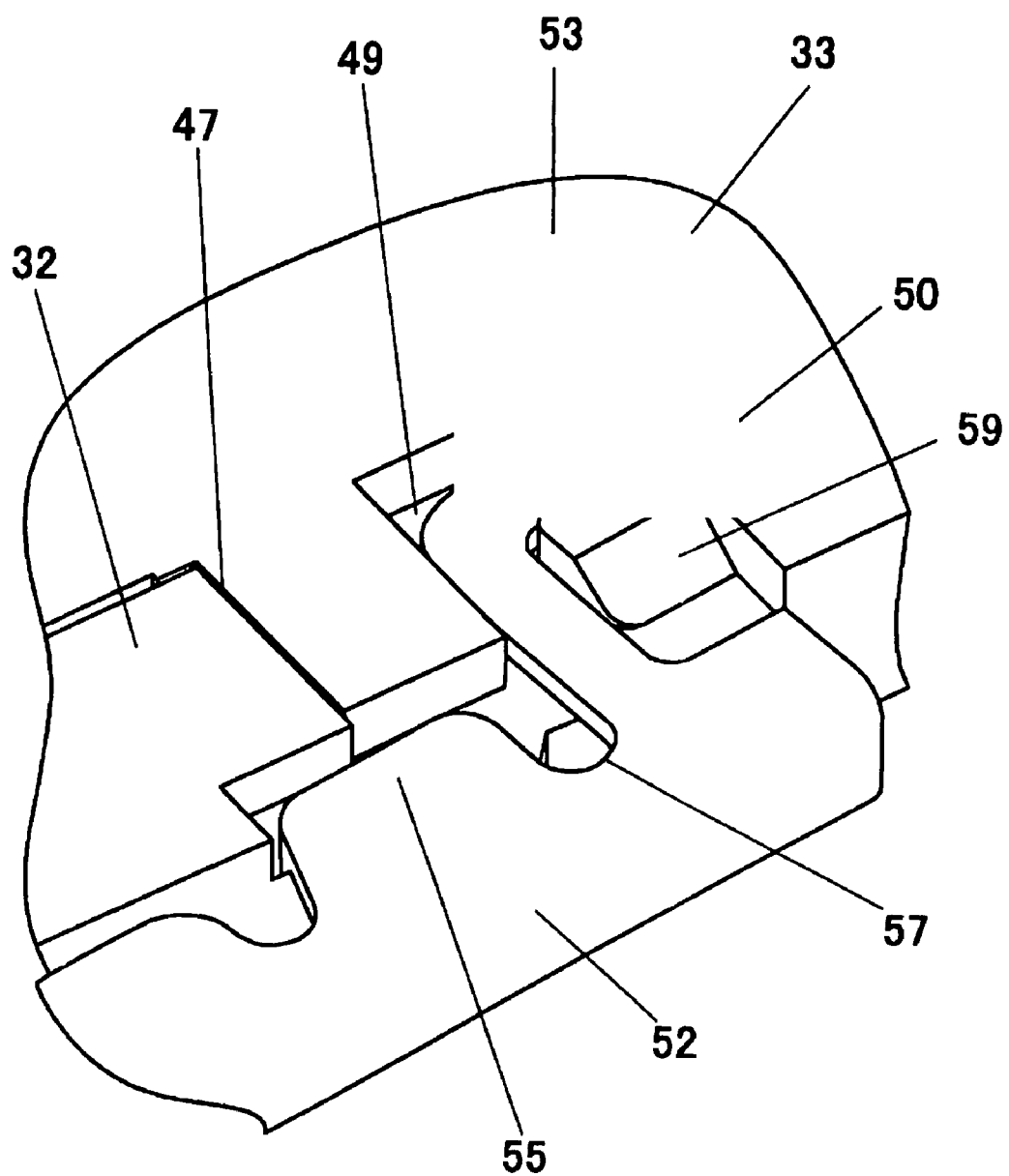
FIG. 26 is a magnifying perspective view showing a part of a surface light source device having a fit piece in a different shape.
Figure 27:
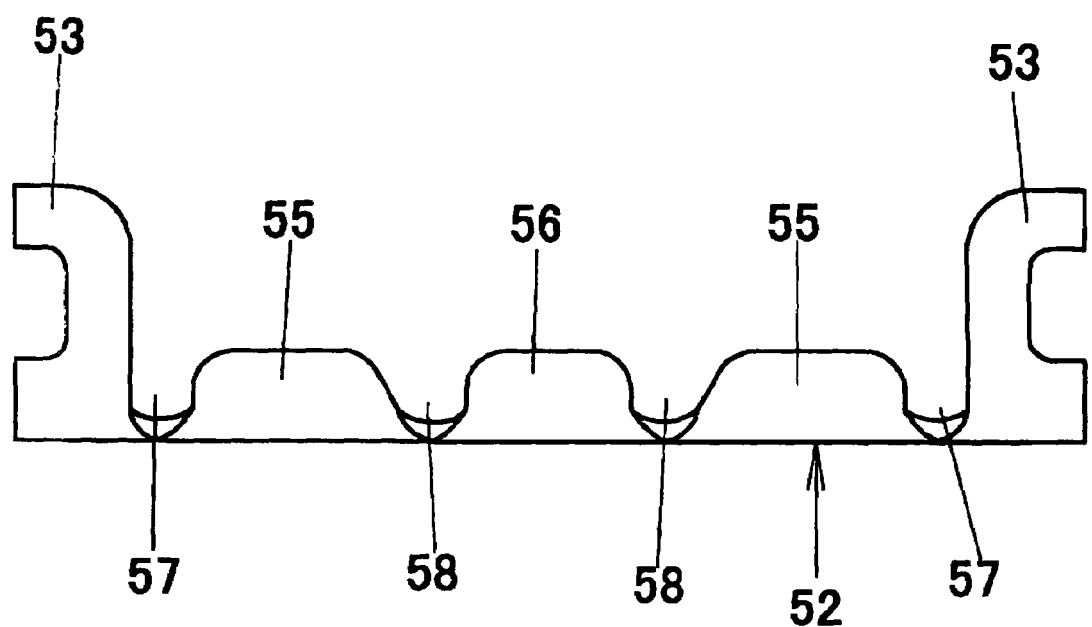
FIG. 27 is a plan view of the metal fixture.
Figure 28:
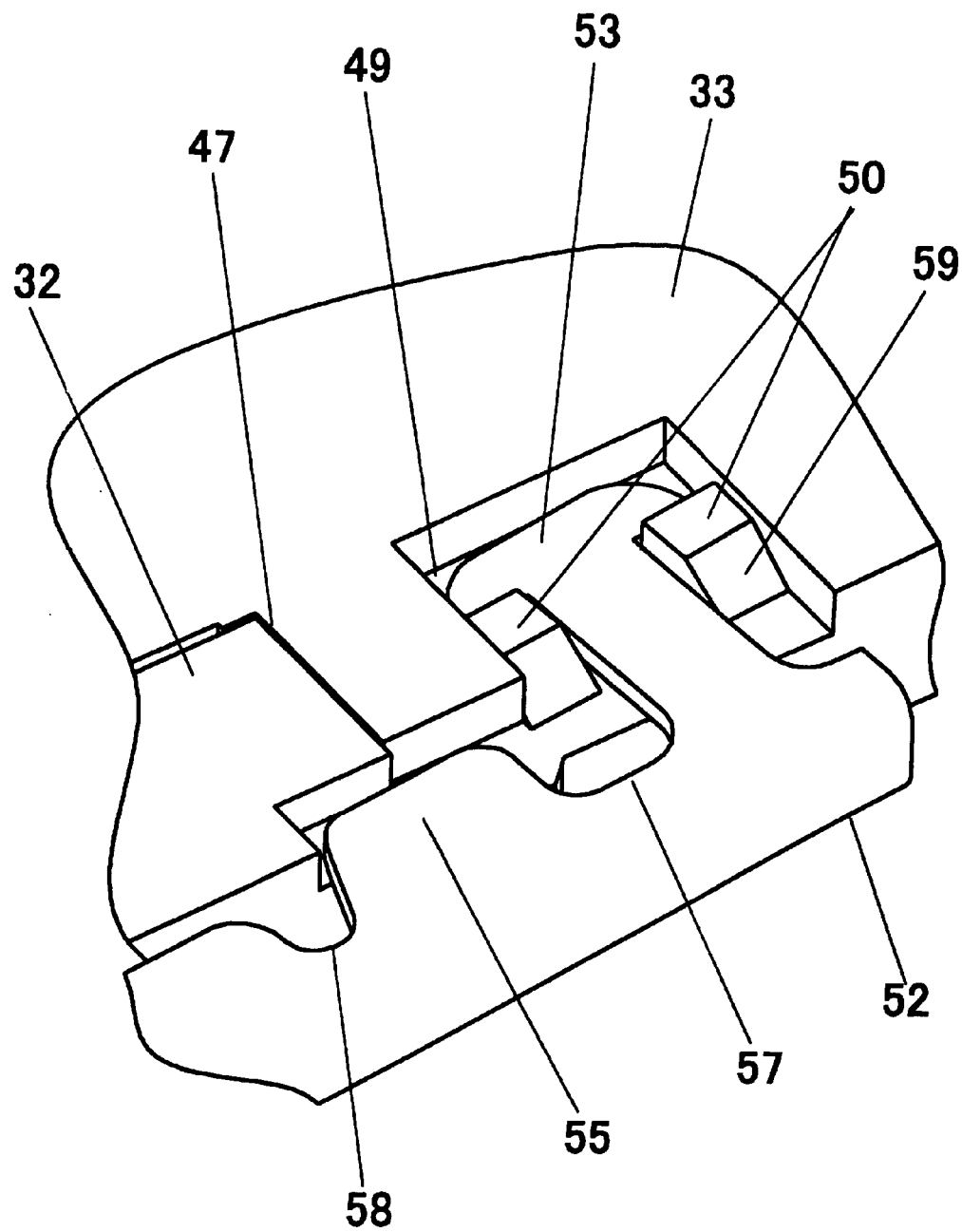
FIG. 28 is a magnifying perspective view showing a part of a surface light source device having a fit piece in a further different shape.
Figure 29:
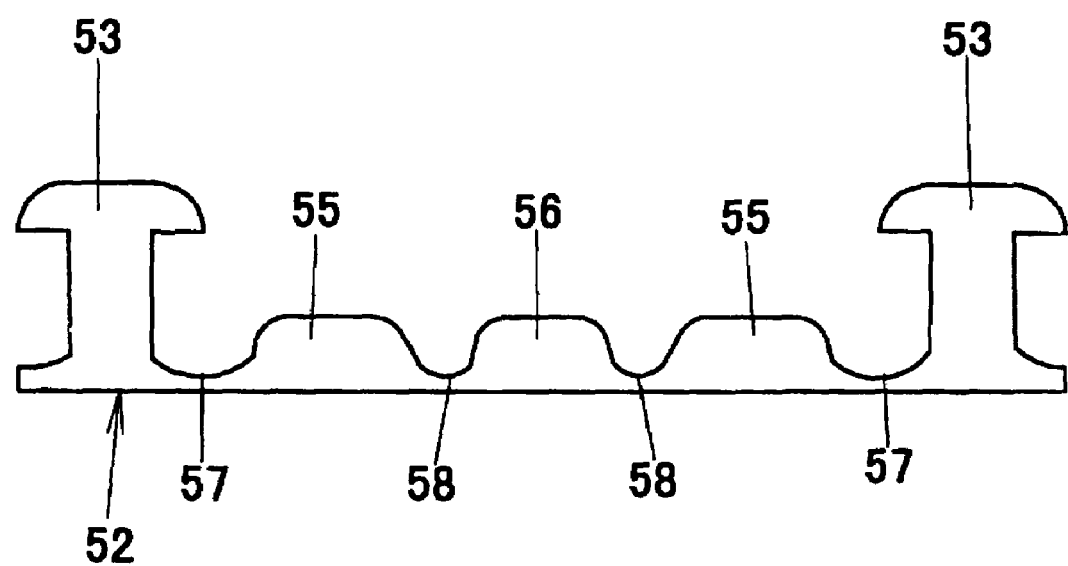
FIG. 29 is a plan view of the metal fixture.

Incidentally, in the foregoing embodiments, the fit piece 53 of the metal fixture 52 is opened with engaging hole 54 to engage the snap 50 therein. However, as shown in FIGS. 26 and 27, the fit piece 53 of the metal fixture 52 may be formed in an L-form or in a hook form, to engage the snap 50 from one side. The use of a metal fixture 52 in such a form, the metal fixture 52 can be shortened in length to reduce the space for attaching the metal fixture 52. Meanwhile, because in this embodiment the sidewall face of the snap 50 is formed integral with the inner peripheral wall surface of the metal fixture 49 as shown in FIG. 26, the snap 50 increases its strength to improve the attachment strength of the metal fixture 52. Meanwhile, as shown in FIGS. 28 and 29, the fit piece 53 of the metal fixture 52 may be formed in a T-form so that the fit piece 53 can engage with two snaps 50 arranged adjacently. Meanwhile, the snaps 50 have respective side faces formed integral with the inner peripheral wall surface of the metal fixture 49. In such an embodiment, the strength of the snap 50 increases. Moreover, because the fit piece 53 is caught and held by two snaps 50, the attachment strength of the metal fixture 52 increases to hold the point light source 32 at greater urging force.

Embodiment 4

Figure 30:
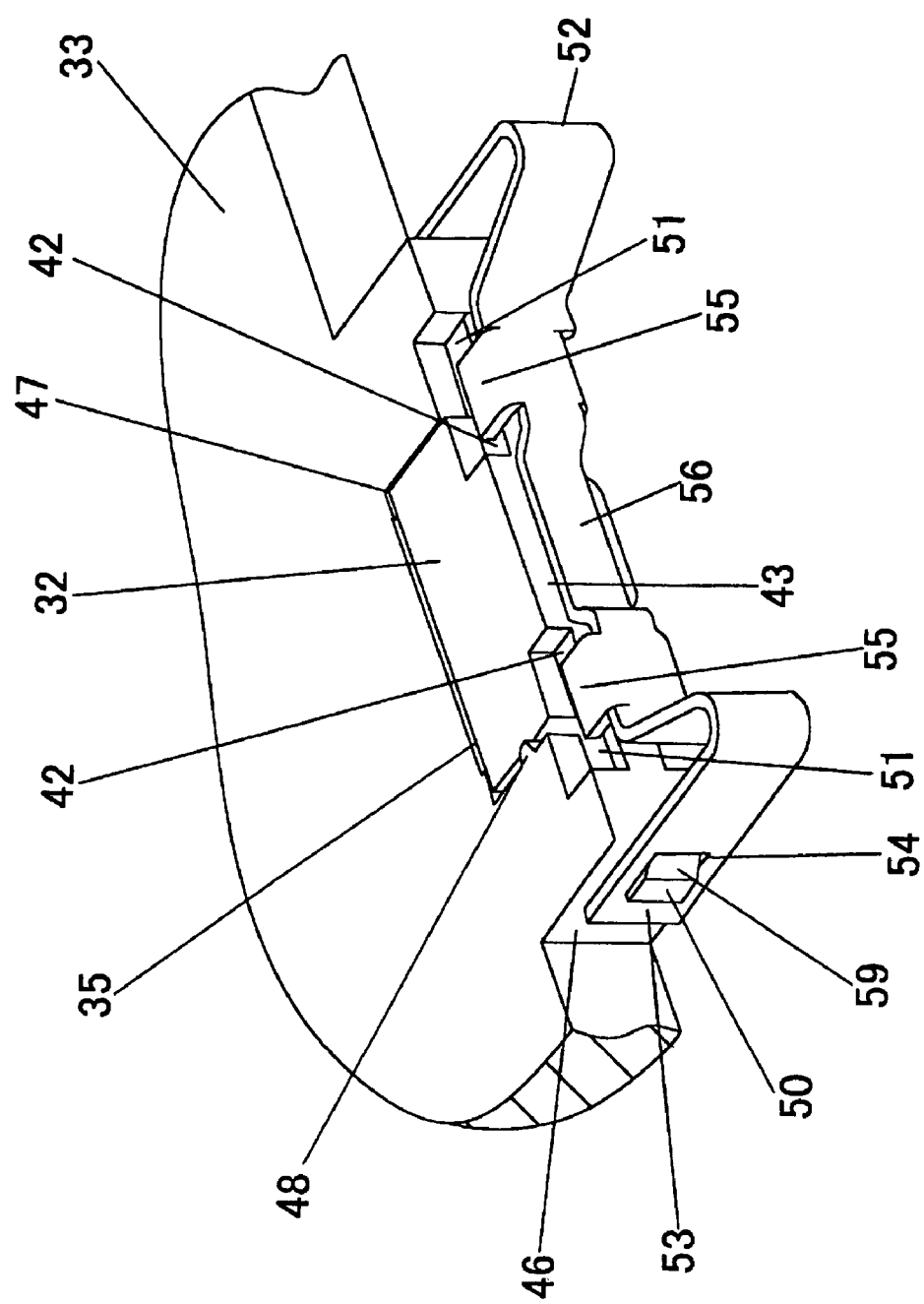
FIG. 30 is an exploded perspective view showing, with magnification, a part of a surface light source device according to embodiment 4 of the invention.

FIG. 30 is an exploded perspective view showing, with magnification, a part of a surface light source device according to embodiment 4 of the invention. In this surface light source device, an extended region 46 is provided centrally in a shorter side of an outer peripheral surface of the light-conductor plate 33, to provide a light-source receiver 47 centrally in the extended region 46. In a deep surface of the light-source receiver 47, a light incident surface 35 is formed to provide a projection 48 protruding in a side surface of the light-source receiver 47. Meanwhile, snaps 50 protrude respectively in left and right surfaces of the extended region 46. On the both sides of the light-source receiver 47, clamp steps 51 are recessed in the upper and lower surfaces of the extended region 46.

The point light source 32, using a structure explained in embodiment 1, is recessed with clamp steps 42 respectively in the upper and lower surfaces at rear left and right sides, wherein a push area 43 is formed in a backside center of the point light source,32.

A metal fixture 52 is worked by bending a metal material of a stainless steel sheet, a steel sheet, an aluminum sheet or the like, and bent in a bow form in plan. The metal fixture 52 has both-side pieces bent forward to be parallel with each other into fit pieces 53. The fit piece 53 is opened with an engaging hole 54 in a tip thereof. Meanwhile, the metal fixture 52 has a central portion made as an abutment piece 56 bent forward in a swelling fashion. On the both sides of the abutment piece 56, clamp pieces 55 extend forward from its upper and lower portions thereof.

Consequently, in this embodiment, after putting the point light source 32 in the light-source receiver 47 of the light-conductor plate 33, the metal fixture 52 is attached onto the point light source 32 and extended region 46 from back of the point light source 32. By the clamp pieces 55, clamped are the interval between the clamp steps 51 of the light-conductor plate 33 and the clamp steps 42 of the point light source 32, to grip those together. By means of the metal fixture 52, the point light source 32 is vertically aligned relative to the light-conductor plate 33. Then, when the metal fixture 52 is pushed forward, the snap 50 engages in the engaging hole 54 of the fit piece 53 and the fit piece 53 is caught by the snap 50. At this time, the abutment piece 56 abuts against the push area 43 of the point light source 32 thereby elastically deforming the metal fixture 52. By the elastic reactive force, the point light source 32 is urged on the light incident surface 35 of the light-conductor plate 33.

In also this embodiment, the height of the metal fixture 52 is smaller than the thickness of the light-conductor plate 33. Particularly, the exterior height at between the upper and lower clamp pieces 55 is smaller than the thickness of the light-conductor plate 33. Because the clamp pieces 55 grip the clamp steps 51 of the light-conductor plate 33 and the clamp steps 42 of the point light source 32, the metal fixture 52 does not protrude from the upper and lower surfaces of the light-conductor plate 33, thus achieving the thickness reduction for the surface light source device.

Embodiment 5

Figure 31:
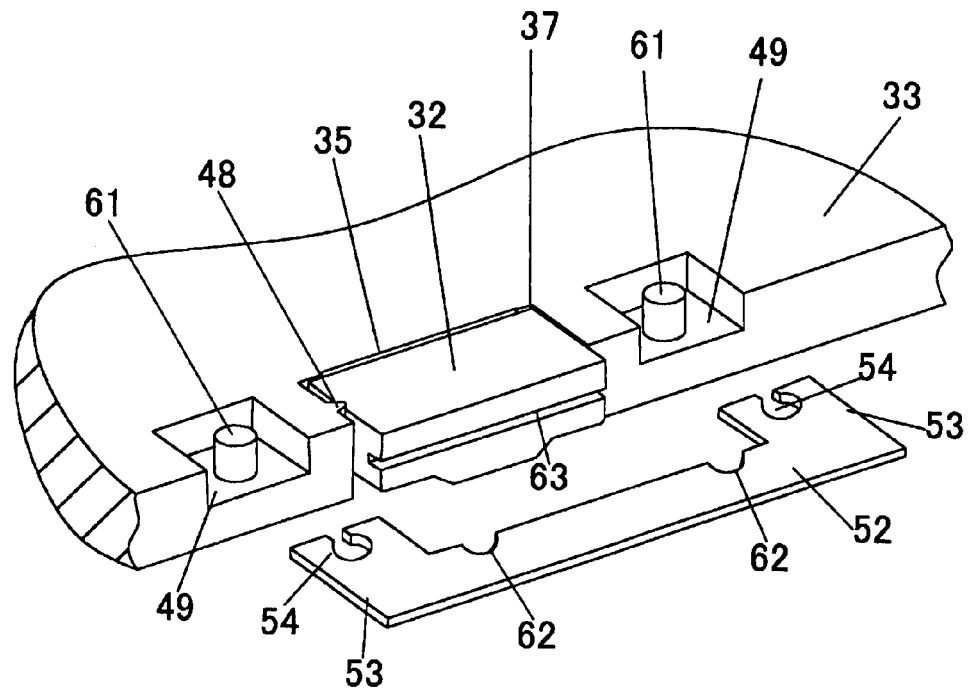
FIG. 31 is an exploded perspective view showing, with magnification, a part of a surface light source device according to embodiment 5 of the invention.

FIG. 31 is an exploded perspective view showing, with magnification, a part of a surface light source device according to embodiment 5 of the invention. In this surface light source device, a light-source receiver 47 is provided in an outer peripheral surface of the light-conductor plate 33 at a center in a shorter side thereof. In a deep surface of the light-source receiver 47, a light incident surface 35 is formed. A projection 48 protrudes in the side surface of the light-source receiver 47. Meanwhile, on the left and right sides of the light-source receiver 47, there are provided fixture-fit areas 49 having a depth nearly a half of the thickness of the light-conductor plate 33. Crimp pins 61 are provided standing in the bottom surfaces of the fixture-fit areas 49.

A metal fixture 52 is formed in generally a squared-U form by a tabular metal plate, having, at both ends, fit pieces 53 whose tips are opened with snap-formed engaging holes 54 partly released. Meanwhile, somewhat inner than the fit pieces 53 in the metal fixture 52, cutouts 62 are provided to provide elasticity to the metal fixture 52. Meanwhile, in a backside of a point light source 32, there is cut throughout the width a positioning slit 63 having a vertical width equal to the thickness of the metal fixture 52. Incidentally, the slit cross-sectional form may be a V-groove.

Consequently, in this embodiment, after putting the point light source 32 in the light-source receiver 47 of the light-conductor plate 33, the metal fixture 52 is positioned in back of the point light source 32 and the metal fixture 52 is fit in the positioning slit 63 of the point light source 32, and the engaging hole 54 of the fit piece 53 is fit over the crimp pin 61 in a snap manner. Then, the crimp pin 61 is thermally crimped to thereby fix the metal fixture 52 to the light-conductor plate 33, thus preventing the metal fixture 52 from floating. In the state the metal fixture 52 is fixed on the light-conductor plate 33, the metal fixture 52 is elastically bent in the positions of cutouts 62. By the elastic reactive force, the point light source 32 is urged on the light incident surface 35 of the light-conductor plate 33. Meanwhile, the fit piece 53 of the metal fixture 52 is vertically aligned by the fixture-fit area 49 and fixed by the crimp pin 61. The point light source 32 is vertically aligned by fitting the metal fixture 52 in the positioning slit 63, thus vertically aligning the point light source 32 and the light-conductor plate 33. Accordingly, this embodiment also can eliminate the positional variation in attaching the point light source 32 and hence improve light utilization efficiency. Meanwhile, the metal fixture 52 is in a plate form and hence not to protrude in the upper or lower surface of the light-conductor plate 33, thus enabling to reduce the thickness of the surface light source device. Meanwhile, the use of such a structure of metal fixture 52, component cost can be lowered.

Although not shown, this embodiment can use a wire material, such as a piano wire, in place of the metal fixture 52 in the above plate form. Namely, a wire material, as a metal fixture 52, at its one end is wound over the crimp pin 61 and the crimp pin 61 is thermally crimped to fix the one end of the wire material. Then, the wire material is passed through the positioning slit 63 of the point light source 32. While applying a tension to the wire material, the other end thereof is connected to the crimp pin 61, and the crimp pin 61 is thermally crimped with the wire material thereby fixing the other end of the wire material. In such a modification, the point light source 32 can be urged on the light-conductor plate 33 by the tension through the wire material. Meanwhile, by stretching the wire material, the point light source 32 can be vertically aligned.

Embodiment 6

Figure 32:
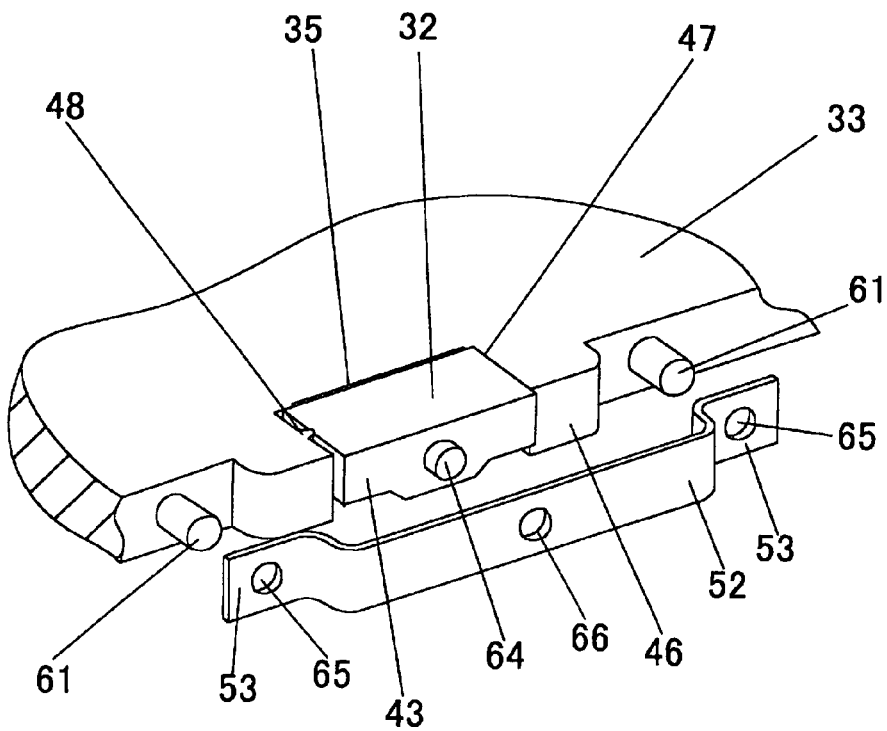
FIG. 32 is an exploded perspective view showing, with magnification, a part of a surface light source device according to embodiment 6 of the invention.

FIG. 32 is an exploded perspective view showing, with magnification, a part of a surface light source device according to embodiment 6 of the invention. In this surface light source device, an extended region 46 protrudes centrally in a shorter side, in an outer peripheral surface of the light-conductor plate 33, to provide a light-source receiver 47 in the center of the extended region 46. In a deep surface of the light-source receiver 47, a light incident surface 35 is formed to have a projection 48 protruding in a side surface of the light-source receiver 47. Meanwhile, crimp pins 61 project horizontally in the outer peripheral surface of the light-conductor plate 33 in a manner sandwiching the extended region 46.

The point light source 32 has a thickness equal to or smaller than the thickness of the light-conductor plate 33. The point light source 32 has a depth greater than the depth of the light-source receiver 47 so that, when the point light source 32 is put in the light-source receiver 47, a push area 43 positioned in the rear end of the point light source 32 protrudes from the light-source receiver 47. Furthermore, a positioning projection 64 protrudes centrally in the push area 43.

The metal fixture 52 is worked by bending a strip metal sheet, having a height (width of the strip metal plate) equal to or smaller than the thickness of the light-conductor plate 33. The metal fixture 52 is bent along a contour extending from a region left to the extended region 46 of the light-conductor plate 33 to a region right to the extended region 46 through the extended region 46. In the fit pieces 53 positioned in the respective ends, crimp holes 65 are opened with a diameter equal to the diameter of the crimp pin 61. The metal fixture 52, at its center, is opened with a positioning hole 66 having a diameter equal to the diameter of the positioning projection 64. Incidentally, the crimp holes 65 and positioning hole 66 may be made horizontally long in order to absorb pitch errors.

Consequently, in this embodiment, after putting the point light source 32 in the light-source receiver 47 of the light-conductor plate 33, the metal fixture 52 is positioned in back of the point light source 32 and extended region 46. The crimp pin 61 is fit in the crimp hole 65 of the metal fixture 52 while the positioning projection 64 is fit in the positioning hole 66, to thermally crimp the crimp pin 61 to the metal fixture 52, thus fixing the metal fixture 52 to the light-conductor plate 33 and vertically aligning the point light source 32 by means of the metal fixture 52.

In this state, the metal fixture 52 is vertically aligned relative to the light-conductor plate 33 by the fitting of the crimp pin 61 and the crimp hole 65. The point light source 32 is vertically aligned relative to the metal fixture 52 by the fitting of the positioning projection 64 and the positioning hole 66. As a result, the point light source 32 is accurately aligned thicknesswise of the light-conductor plate 33. Meanwhile, the push area 43 of the point light source 32 protrudes from the extended region 46 whereby the metal fixture 52 at its center abuts against the push area 43 thus being pushed back. By the elastic reactive force of the metal fixture 52, the point light source 32 is urged on the light incident surface 35 of the light conductor plate 33.

In the embodiment like this, the metal fixture 52 is prevented from protruding from the upper and lower surfaces of the light-conductor plate 33 by making the height of the metal fixture 52 smaller than the thickness of the light-conductor plate 33, thus enabling to reduce the thickness of the light-conductor plate 33. Furthermore, the metal fixture 52 can be fabricated by merely bending a strip metal plate opened with a crimp hole 65 and positioning hole 66, thus rendering the cost low.

Incidentally, the above embodiment provided the positioning projection 64 on the point light source 32, and the positioning hole 66 in the metal fixture 52. Conversely, the positioning hole 66 may be provided in the point light source 32 while a positioning projection 64 be in the metal fixture 52.

Embodiment 7

Figure 33:
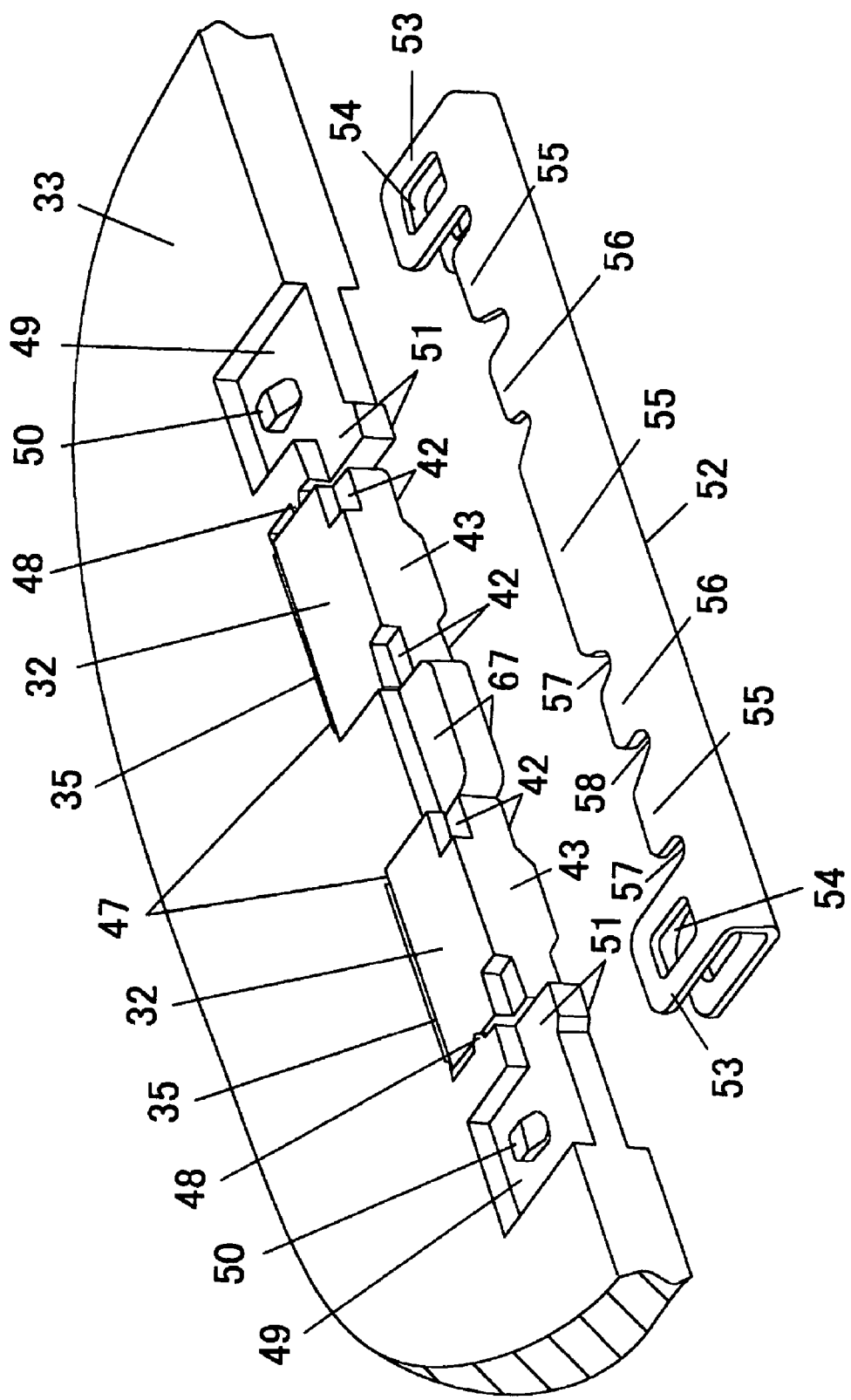
FIG. 33 is an exploded perspective view showing, with magnification, a part of a surface light source device according to embodiment 7 of the invention.

In the invention, a plurality of point light sources 32 may be attached by means of one metal fixture 52. For example, FIG. 33 is an exploded perspective view showing, with magnification, a part of a surface light source device according to embodiment 7 of the invention. In this surface light source device, two light-source receivers 47 are recessed side by side in a light-conductor plate 33, to form clamp steps 67 in the upper and lower surfaces of between the both light-source receivers 47. Clamp steps 51 and fixture-fit areas 49 are provided on the outer sides of those. The fixture-fit areas 49 are respectively provided with snaps 50.

The two point light sources 32 are those as shown in FIG. 21, for example, wherein clamp steps 42 are formed on both sides in the upper and lower surface while a push area 43 is provided in a backside thereof.

A metal fixture 52 is provided with fit pieces 53 having engaging holes 54 at respective ends, clamp pieces 55 on the inner side thereof, abutment pieces 56 on the inner side thereof, and broad clamp pieces 55 between the abutment pieces 56. Cutouts 57 are formed between the engaging hole 54 and the clamp piece 55 while cutouts 58 are formed between the clamp piece 55 and the abutment piece 56.

Consequently, after putting the point light sources 32 respectively in the light-source receivers 47 of the light-conductor plate 33, the fit piece 53 is engaged on the snap 50 in the fixture-fit area 49 thereby attaching the metal fixture 52 to the light-conductor plate 33. The clamp pieces 55, on the both sides, clamp and grip the thickness-reduced portion between the clamp steps 51 of the light-conductor plate 33 and the thickness-reduced portion between the clamp steps 42 of the point light source 32. The central clamp pieces 55 clamp and grip the thickness-reduced portion between the clamp steps 67 of the light-conductor plate 33 and the thickness-reduced portion between the clamp steps 42 of the point light source 32. Due to this, the point light sources 32 are aligned thicknesswise relative to the light-conductor plate 33. Meanwhile, the point light sources 32 are respectively urged on the light incident surfaces 35 by abutting the abutment pieces 56 of the elastically deflected metal fixture 52 against the push area 43 of the point light sources 32.

Although, here, the two point light sources 32 were attached by one metal fixture 52, three or more point light sources 32 can be attached. By attaching a plurality of point light sources 32 by one metal fixture 52, assembling can be simplified and cost be lowered. Meanwhile, although the above illustrated embodiment used the plurality of point light sources 32 with the structure as in embodiment 1, a plurality of point light sources 32 can be naturally attached also in another of the embodiments.

Embodiment 8

Figure 34:
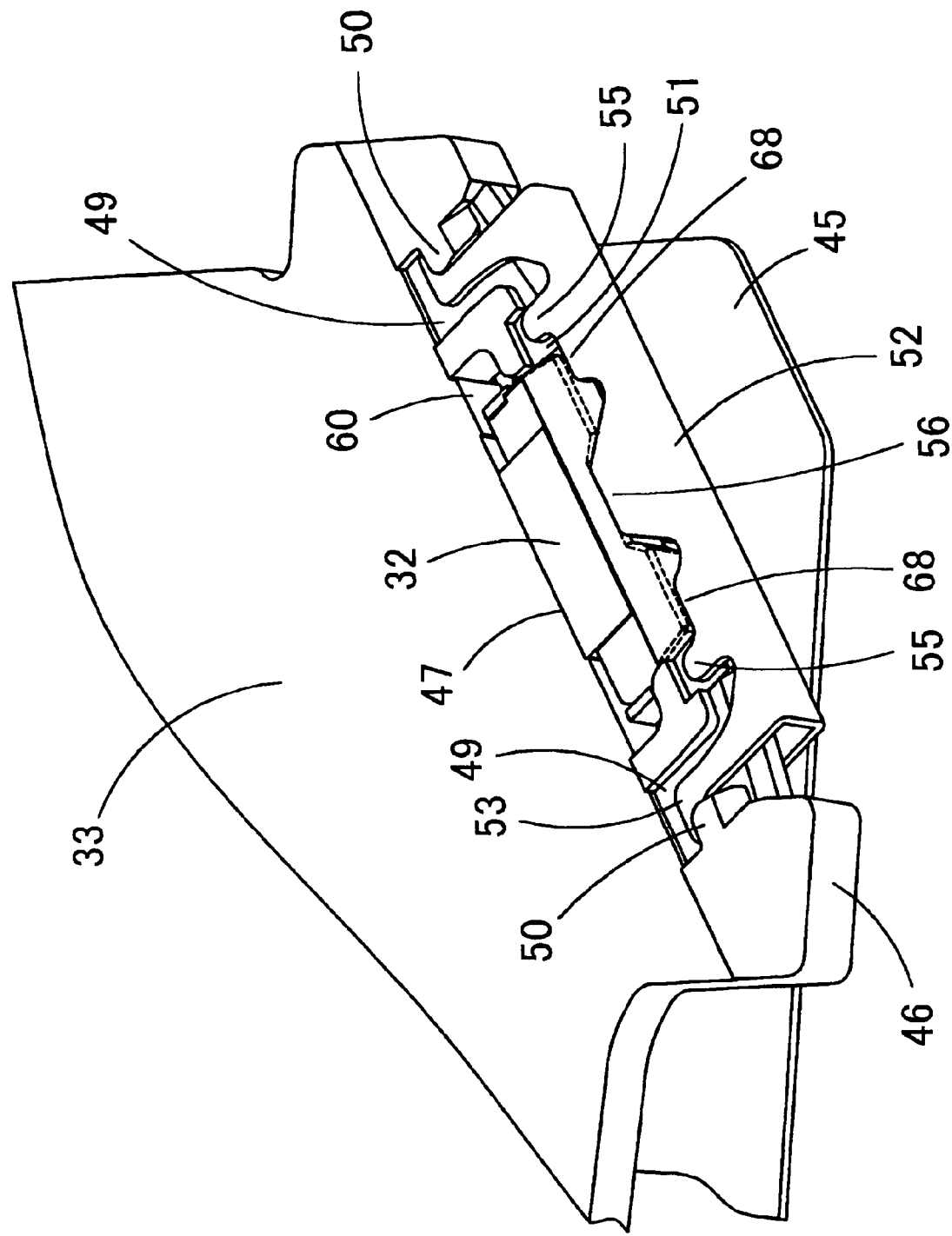
FIG. 34 is perspective view showing, with magnification, a part of a surface light source device according to embodiment 8 of the invention.
Figure 35:
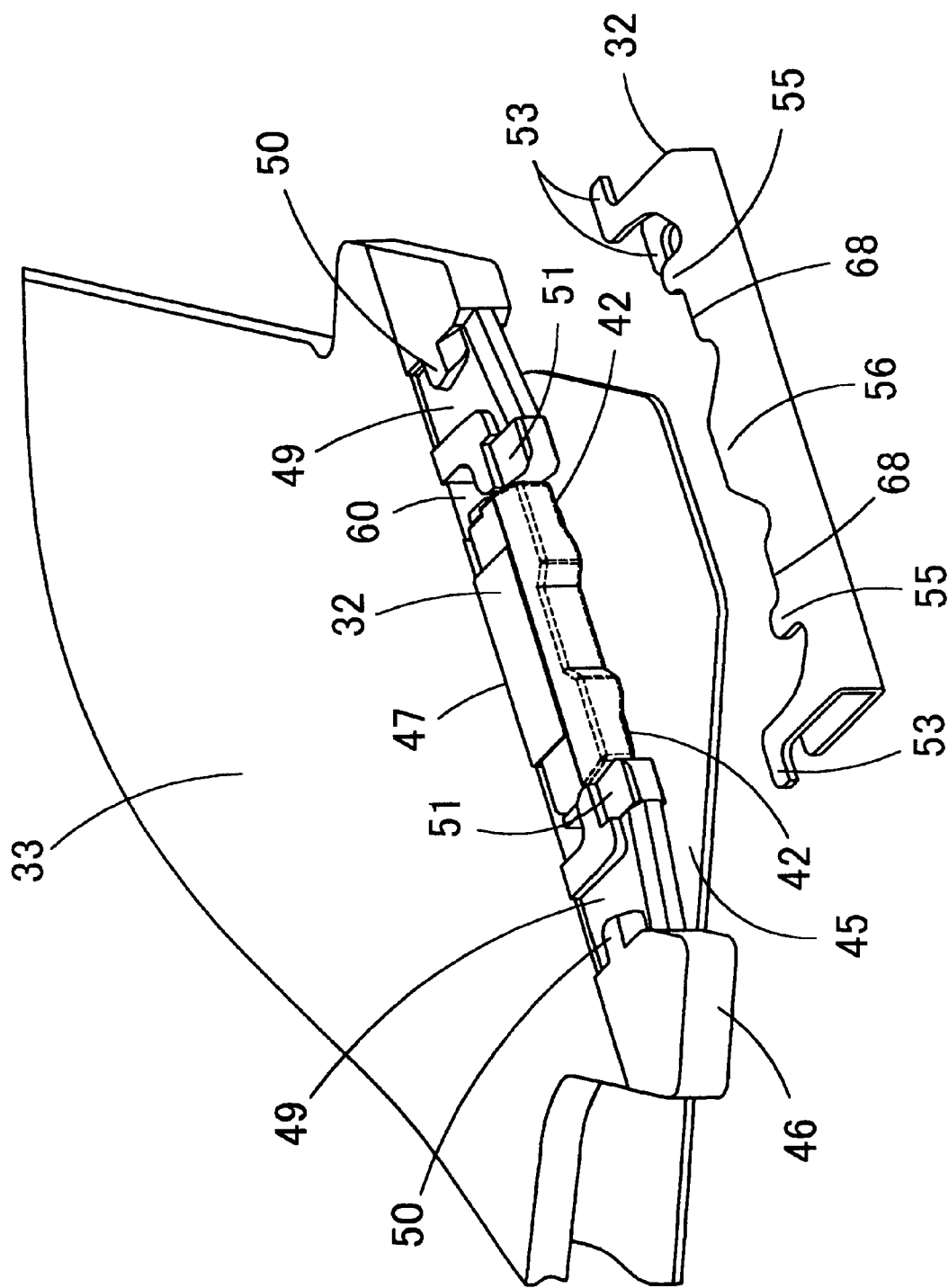
FIG. 35 is an exploded perspective view showing, with magnification, a part of the surface light source device according to embodiment 8.
Figure 36:
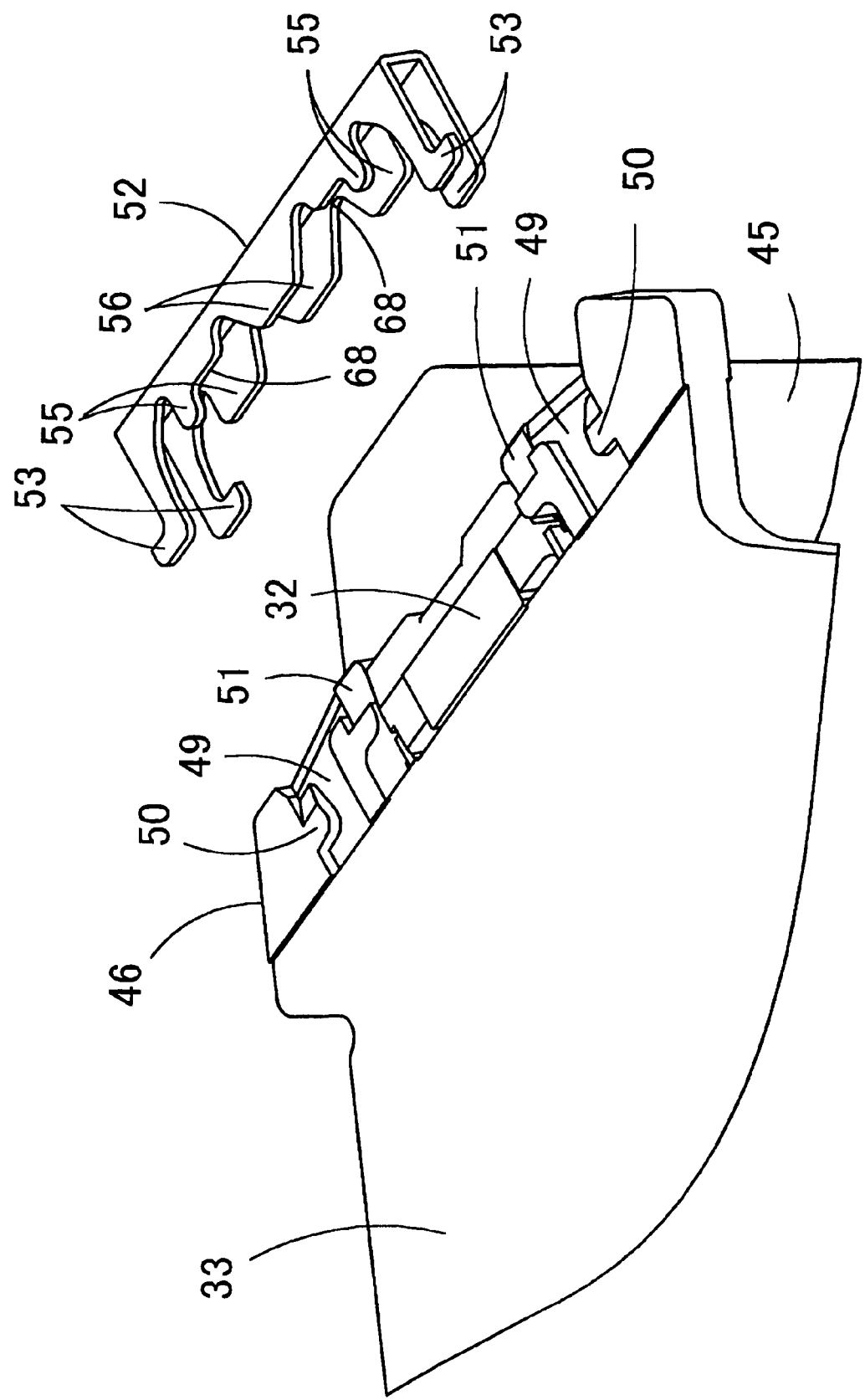
FIG. 36 is an exploded perspective view in a different direction showing, with magnification, a part of the surface light source device according to embodiment 8.

FIG. 34 is a perspective view showing, with magnification, a part of a surface light source device according to embodiment 8 of the invention. FIG. 35 is an exploded perspective view showing, with magnification, a part of the surface light source device. FIG. 36 is an exploded perspective view showing, with magnification, a part of the surface light source device, which is in a different direction. The point light source 32 used in this embodiment is structured similarly to the point light source 32 (FIG. 25) used in embodiment 3. Namely, the point light source 32 in embodiment 8, although formed with somewhat concavo-convexes in the upper surface, is formed with clamp steps 42 on both sides only in the lower surface instead of in the upper surface thereof. The point light source 32 is reduced in thickness by not providing clamp steps 42 in the upper surface of the point light source 32. Specifically, the point light source 32 has a thickness 0.6 mm. Namely, provided that the point light source 32 structured as in FIG. 21 has a thickness 0.8 mm, the thickness of the point light source 32 can be given 0.6 mm by removing the point light source 32 of its protruding portion, at the upper surface thereof, from the clamp step 42. Incidentally, the clamp step 42 in the lower surface of the point light source 32 has a depth equal to the thickness 0.1 mm of the metal fixture 52.

Meanwhile, although the light-conductor plate 33 in embodiment 3 has a thickness 0.8 mm greater than the point light source 32, the light-conductor plate 33 in embodiment 8 has a thickness 0.5 mm that is smaller than the point light source 32. Meanwhile, in embodiment 8, clamp steps 51 and fixture-fit areas 49 are recessed on both sides of the light-source receiver 47, in both surfaces of the light-conductor plate 33. In the upper surface of the light-conductor plate 33, snaps 50 project in the fixture-fit areas 49 in a manner protruding from the outer side surfaces. In the lower surface of the light-conductor plate 33, snaps 50 project in the fixture-fit areas 49 in a manner protruding from the inner side surfaces.

In this embodiment, because the clamp steps 42 are not provided in the upper surface of the point light source 32, in case the point light source 32 is held at its both surfaces by a metal fixture 52 as in embodiment 1-7, the metal fixture 52 protrudes above the point light source 32 and light-conductor plate 33 thus increasing the thickness of the surface light source device. For this reason, in the lower surface side where clamp steps 42 are provided in the point light source 32, the clamp steps 42 of the point light source 32 and the clamp steps 51 of the light-conductor plate 33 are held from below by clamp pieces 55 of the metal fixture 52 similarly to embodiment 1-7. However, in the upper surface side where clamp steps 42 are not provided in the point light source 32, embodiment 8 holds only the clamp steps 51 of the light-conductor plate 33 from above by means of clamp pieces 55 of the metal fixture 52 in embodiment 8. The clamp pieces 55 of the metal fixture 52 do not hold the upper surface of the point light source 32.

Consequently, a cutout 68 is provided in a position corresponding to the point light source 32, in the upper-surface clamp piece 55 of the metal fixture 52 as shown in FIGS. 35 and 36, in a manner not to overlap with the point light source 32 when attached to the light-conductor plate 33. In the upper surface side, the clamp piece 55 is made in a manner avoiding the position for the point light source 32. As a result, the metal fixture 52 can be given a thickness of 0.6 mm similarly to the point light source 32.

Meanwhile, the point light source 32 is previously mounted, by a solder, on a flexible printed board 45 sufficiently greater as compared to the planar surface area of the point light source 32 or the light-source receiver 47. When attaching the point light source 32 to the light-conductor plate 33, the point light source 32 mounted on the flexible printed board 45 is put in the light-source receiver 47 from below. In case the point light source 32 is put in the light-source receiver 47, when the flexible printed board 45 comes into abutment against the lower surface of the light-conductor plate 33, the point light source 32 no longer moves upward. Moreover, design is made such that, when the flexible printed board 45 goes into abutment against the lower surface of the light-conductor plate 33, the point light source 32 takes a desirable vertical position for the light incident surface 35 of the light-conductor plate 33.

Then, as shown in FIG. 34, the metal fixture 52 is attached to the light-conductor plate 33 from back of the point light source 32. At this time, the lower clamp piece 55 of the metal fixture 52 is inserted to between the clamp step 42 of the light source 32 and the flexible printed board 45. In the state the contact piece 56 of the metal fixture 52 is abutted against the back surface of the point light source 32, the fit piece 53 of the metal fixture 52 is engaged on the snap 50 of the light-conductor plate 33. The metal fixture 52 at its upper and lower clamp pieces 55 grips the upper and lower clamp steps 51 of the light-conductor plate 33. This vertically aligns the metal fixture 52 relative to the light-conductor plate 33.

In the state the point light source 32 is attached on the light-conductor plate 33 by the metal fixture 52, the point light source 32 at its front surface is urged on the abutment surface 60 of the light-conductor plate 33 through the elasticity of the point light source 32 whereby the point light source 32 is aligned in a front-rear direction. The projection 48, in the side surface of the light-source receiver 47, abuts against a side surface of the point light source 32 thus aligning the point light source 32 in a left-right direction. Furthermore, the lower clamp piece 55 of the point light source 32 holds the clamp step 42 in the lower surface of the point light source 32 thereby preventing the point light source 32 from being detached downward from the light-source receiver 47. Because the clamp piece 55 in the upper surface of the metal fixture 52 is provided avoiding the point light source 32, the point light source 32 cannot be held from above by a certain metal fixture 52. However, the point light source 32 is regulated not to be detached upward from the light-source receiver 47 by the abutment of the flexible printed board 45 against the lower surface of the light-conductor plate 33. Accordingly, in this embodiment, the point light source 32 can be vertically aligned by the cooperation of the clamp pieces 55 in the lower surface of the metal fixture 52 and the flexible printed board 45. Furthermore, thickness reduction is available for the surface light source device.

In the metal fixture 52 of such a structure, structure is not symmetric vertically but shape is different between the upper surface side and the lower surface side. Consequently, in case the metal fixture 52 is attached incorrect vertically during attaching of the point light source 32 to the light-conductor plate 33, the point light source 32 is to pass the cutout 68 of the clamp piece 55 and fall down, together with the flexible printed board 45, out of the light-source receiver 47 because the point light source 32 at its lower surface is not held by the clamp piece 55. For this reason, in this embodiment, the fit piece 53 on the upper surface side is bent L-form directed outward while the fit piece 52 on the lower surface side is bent L-form directed inward. Correspondingly, in the light-conductor plate 33, the snap 50, in the fixture-fit area 49 on the upper surface side, protrudes inward from the outer side surface of the left and right side surfaces. The snap 50, in the fixture-fit area 49 on the lower surface side, protrudes outward from the inner side surface of the left and right side surfaces. Accordingly, in the case the metal fixture 52 is correct vertically (as to main or back surface), the upper and lower fit pieces 53 can be respectively engaged on the upper and lower snaps 50 of the light-conductor plate 33. However, when the metal fixture 52 is incorrect vertically (as to main or back surface), the upper and lower fit pieces 53 cannot be respectively engaged on the upper and lower snaps 50 of the light-conductor plate 33. Based on this, the point light source 32 is prevented from disengaging due to incorrectly directed metal fixture 52.

The invention claimed is:

1. A surface light source device comprising:
   a light-conductor plate that conducts light at an interior and allows same to exit at a light-exit surface to an outside; and
   a light source arranged oppositely to a light incident surface of the light-conductor plate and small in size as compared to a width of the light-conductor plate;
   the light source being held by a fixture engaged on the light-conductor plate, the fixture in part being elastically abutted against an opposite surface of the light source to a surface thereof facing to the light incident surface thereby urging the light source on the light incident surface, wherein
   the fixture and the light-conductor plate have aligning means for aligning the fixture and the light-conductor plate to each other thicknesswise of the light-conductor plate, the fixture and the light source having aligning means for aligning the fixture and the light source to each other thicknesswise of the light-conductor plate.

2. A surface light source device according to claim 1, wherein means for aligning the fixture and the light-conductor plate is constituted by providing a thickness-reduced portion in a vicinity of the light incident surface of the light-conductor plate, and clamping the thickness-reduced portion by a pair of parallel protuberances provided in the fixture.

3. A surface light source device according to claim 1, wherein means for aligning the fixture and the light-conductor plate is constituted by forming one of a positioning projection or a positioning hole in any of a recess provided in an upper surface or an lower surface of the light-conductor plate, a side surface of the light-conductor plate and a front surface of the light-conductor plate, forming other of the positioning projection or the positioning hole in the fixture, and fitting the positioning projection in the positioning hole.

4. A surface light source device according to claim 1, wherein means for aligning the fixture and the light source is constituted by providing a thickness-reduced portion at least in a part of the light source, and clamping the thickness-reduced portion by a pair of parallel protuberances provided in the fixture.

5. A surface light source device according to claim 1, wherein means for aligning the fixture and the light source is constituted by forming one of a positioning projection or a positioning hole in any of a recess provided in an upper surface or an lower surface of the light source, a side surface of the light source and a front surface of the light source, forming other of the positioning projection or the positioning hole in the fixture, and fitting the positioning projection in the positioning hole.

6. A surface light source device according to claim 1, wherein means for aligning the fixture and the light source is constituted by forming a positioning slit in a back surface of the light source, and fitting a part of the fixture in the positioning slit.

7. A surface light source device comprising:
   a light-conductor plate that conducts light at an interior and allows same to exit at a light-exit surface to an outside; and
   a light source arranged oppositely to a light incident surface of the light-conductor plate and small in size as compared to a width of the light-conductor plate;
   the light source being held by a fixture engaged on the light-conductor plate, the fixture in part being elastically abutted against an opposite surface of the light source to a surface thereof facing to the light incident surface thereby urging the light source on the light incident surface, wherein
   the fixture is removably attached on the light-conductor plate, and the fixture is fixed on the light-conductor plate by recessing fixture-fit areas in upper and lower surfaces of the light-conductor plate, providing catches projecting in the fixture-fit areas, providing fit pieces in a ring form, an L-form or T-form in the fixture formed in a folded-double form, and putting the fit pieces on the fixture-fit areas into engagement on the catches.

* * * * *